United States Patent
Friend et al.

(10) Patent No.: US 10,636,993 B2
(45) Date of Patent: Apr. 28, 2020

(54) ELECTROLUMINESCENT DEVICE

(71) Applicants: Cambridge Enterprise Limited, Cambridge (GB); KING ABDULAZIZ CITY FOR SCIENCE & TECHNOLOGY, Riyadh (SA)

(72) Inventors: Richard Friend, Fulbourn (GB); Zhi Kuang Tan, Singapore (SG); Guangru Li, Heilongjiang (CN); Dawei Di, Cambridge (GB); Neil C. Greenham, Cambridge (GB)

(73) Assignees: CAMBRIDGE ENTERPRISE LIMITED, Cambridge (GB); KING ABDULAZIZ CITY FOR SCIENCE & TECHNOLOGY, Riyadh (SA)

( * ) Notice: Subject to any disclaimer, the term of this patent is extended or adjusted under 35 U.S.C. 154(b) by 219 days.

(21) Appl. No.: 15/531,404

(22) PCT Filed: Nov. 20, 2015

(86) PCT No.: PCT/GB2015/053557
§ 371 (c)(1),
(2) Date: May 26, 2017

(87) PCT Pub. No.: WO2016/083783
PCT Pub. Date: Jun. 2, 2016

(65) Prior Publication Data
US 2017/0324057 A1    Nov. 9, 2017

(30) Foreign Application Priority Data
Nov. 28, 2014  (GB) .................................. 1421133.8

(51) Int. Cl.
*H01L 51/00*   (2006.01)
*H01L 51/50*   (2006.01)

(52) U.S. Cl.
CPC ...... *H01L 51/5096* (2013.01); *H01L 51/0077* (2013.01); *H01L 51/502* (2013.01);
(Continued)

(58) Field of Classification Search
None
See application file for complete search history.

(56) References Cited

U.S. PATENT DOCUMENTS 5,882,548 A * 3/1999 Liang .................... C07C 211/65
                                                                 252/301.16
6,344,662 B1   2/2002 Dimitrakopoulos et al.
(Continued)

FOREIGN PATENT DOCUMENTS

JP    2008-227330 A    9/2008
JP    2014-078392 A    5/2014
(Continued)

OTHER PUBLICATIONS

Carnie et al. "A one-step low temperature processing route for organolead halide perovskite solar cells" Chem. Commun, 2013, 49, 7893-7895. (Year: 2013).*
(Continued)

*Primary Examiner* — Robert S Loewe
(74) *Attorney, Agent, or Firm* — McCarter & English, LLP; Yu Lu

(57) ABSTRACT

Broadly speaking, embodiments of the present invention provide a solid state light-emitting device and a method of manufacturing the solid state light-emitting device. The method comprises preparing a thin layer of semiconducting perovskite nanoparticles embedded in a matrix or blend of a material that has a wider band gap than the semiconducting perovskite nanoparticles. In embodiments, the method comprises blending a solution of a semiconducting perovskite material or a precursor therefor with a solution of a material
(Continued)

that has a wider band gap than the semiconducting perovskite material or a precursor therefor followed by removal of the solvent from the mixture thus formed, to give the semiconducting perovskite nanoparticles embedded in a matrix or blend of the material that has a wider band gap than the semiconducting perovskite nanoparticles.

10 Claims, 8 Drawing Sheets

(52) U.S. Cl.
CPC .. *H01L 51/0003* (2013.01); *H01L 2251/5369* (2013.01); *Y02E 10/549* (2013.01); *Y02P 70/521* (2015.11)

(56) References Cited

U.S. PATENT DOCUMENTS

| | | | |
|---|---|---|---|
| 6,420,056 | B1 | 7/2002 | Chondroudis et al. |
| 7,105,360 | B2* | 9/2006 | Dehaven ............ H01L 51/0002 252/301.16 |
| 7,641,815 | B2* | 1/2010 | Varadarajan ......... C09K 11/616 252/301.4 H |
| 9,908,906 | B2* | 3/2018 | Ma ..................... H01L 51/0032 |
| 9,966,198 | B2* | 5/2018 | Kanatzidis ............ H01L 31/032 |
| 2011/0180757 | A1* | 7/2011 | Vockic .................. H01L 31/055 252/301.4 F |
| 2012/0146007 | A1* | 6/2012 | Snaith ................... H01L 51/422 257/40 |
| 2012/0306053 | A1* | 12/2012 | Shum .................. C04B 35/5152 257/613 |
| 2013/0233377 | A1* | 9/2013 | Kanatzidis ............ H01L 31/032 136/252 |
| 2015/0136232 | A1* | 5/2015 | Snaith ................ H01L 51/4226 136/263 |
| 2015/0144196 | A1* | 5/2015 | Irwin ................... H01G 9/2027 136/261 |
| 2015/0249170 | A1* | 9/2015 | Snaith ................... H01L 51/422 136/256 |
| 2015/0340632 | A1* | 11/2015 | Etgar ................. H01L 51/4226 136/255 |
| 2017/0186922 | A1 | 6/2017 | Kim et al. |

FOREIGN PATENT DOCUMENTS

| | | |
|---|---|---|
| JP | 2014-082377 A | 5/2014 |
| WO | WO 2011/071738 A2 | 6/2011 |
| WO | 2017/108962 A1 | 6/2017 |

OTHER PUBLICATIONS

Electronic Supplementary Information for Carnie et al. "A one-step low temperature processing route for organolead halide perovskite solar cells" 5 pages, 2013. (Year: 2013).*
Liu et al. "Perovskite solar cells with a planar heterojunction structure prepared using room-temperature solution processing techniques" Nature Photonics, 2014, 8, 133-138. (Year: 2014).*
Habisreutinger et al. "Carbon Nanotube/Polymer Composites as a Highly Stable Hole Collection Layer in Perovskite Solar Cells" Nano. Lett. 2014, 14, 5561-5568. (Year: 2014).*
Liu et al. "Efficient planar heterojunction perovskite solar cells by vapour deposition" Nature 2013, 501, 395-399. (Year: 2013).*
Carnie et al. "Performance enhancement of solution processed perovskite solar cells incorporating functionalized silica nanoparticles" J. Mater. Chem. A. 2014, 2, 17077-17084. (Year: 2014).*

Lee et al. "Efficient Hybrid Solar Cells Based on Meso-Superstructures Organometal Halide Perovskites" Science, 2012, 338, 643-647. (Year: 2012).*
Leijtens et al. "The Importance of Perovskite Pore Filling in Organometal Mixed Halide Sensitized TiO2-Based Solar Cells" J. Phys. Chem. Lett. 2014, 5, 1096-1102. (Year: 2014).*
Supporting Information for Ball et al. (Energy Environ. Sci. 2013, 6, 11 pages). (Year: 2013).*
Ball et al. "Low-temperature processed meso-superstrucutred to thin-film perovskite solar cells" Energy Environ. Sci. 2013, 6, 1739-1743. (Year: 2013).*
Absi-Halabi et al. "Studies on Pore Size Control of Alumina: Preparation of Alumina Catalyst Extrudates with Large Unimodal Pore Structure by Low Temperature Hydrothermal Treatment" Preparation of Catalysts V, 1991, 155-163. (Year: 1991).*
International Search Report and Written Opinion dated Feb. 22, 2016 in connection with International Application No. PCT/GB2015/053557.
International Preliminary Report on Patentability dated Jun. 8, 2017 in connection with International Application No. PCT/GB2015/053557.
Ball et al., Low-temperature processed meso-superstructured to thin-film perovskite solar cells. Energy & Environmental Science. Jan. 2013;6(6):1739.
Burroughes et al., Light-emitting diodes based on conjugated polymers , Nature Oct. 11, 1990, 347, 539-541.
Burschka et al., Sequential deposition as a route to high-performance perovskite-sensitized solar cells Nature Jul. 18, 2013, vol. 499, 316-319.
Chen et al. Planar Heterojunction Perovskite Solar Cells via Vapor-Assisted Solution Process Am. Chem. Soc. 2014, 136, 622-625.
Coe et al., Electroluminescence from single monolayers of nanocrystals in molecular organic devices Nature Dec. 19-26, 2002, vol. 420, 800-803.
Colvin et al., Light-emitting diodes made from cadmium selenide nanocrystals Nature Aug. 4, 1994, vol. 370, 354-357.
Greenham, Efficient light-emitting diodes based on polymers with high electron affinities, Nature 1 Oct. 14, 993, vol. 365, 628 630.
Greenham, N. C.; Friend, R. H. & Bradley, D. D. C. Angular Dependence of the Emission from a Conjugated Polymer Light-Emitting Diode: Implications for efficiency calculations. Advanced Materials 6, 491-494.
Kim et al., Multicolored Organic/Inorganic Hybrid Perovskite Light-Emitting Diodes Adv. Mater. 2014, 27, 1248-1254.
Kitazawa et al., Preparation and optical properties of nanocrystalline (C6H5C2H4NH3)2PbI4-doped PMMA films. Mater. Sci. 1998, vol. 33, 1441-1444.
Lee, M. M.; Teuscher, J.; Miyasaka, T.; Murakami, T. N.; Snaith, H. J. Science 2012, 338, 643-647.
Liu, M et al., Efficient planar heterojunction perovskite solar cells by vapour deposition. Nature Sep. 19, 2013, vol. 501, 395-398.
Salim et al., Perovskite-based solar cells: impact of morphology and device architecture on device performance, J Matrer. Chem. A 2015, vol. 3 8943-8969.
Schmidt et al., Nontemplate Synthesis of CH3NH3PbBr3 Perovskite Nanoparticles Chem. Soc. 2014, 136, 850-853.
Stranks et al., Electron-Hole Diffusion Lengths Exceeding 1 Micrometer in an Organometal Trihalide Perovskite Absorber Science Oct. 13, 2013, vol. 342, 341-344.
Tan et al, "Bright light-emitting diodes based on organometal halide perovskite", Nature Nanotechnolgy, Sep. 2014, vol. 9.
Tan et al., Bright light-emitting diodes based on organometal halide perovskite Nat. Nanotechnol. Sep. 2014, vol. 9, 687-692.
Wang et al. Ultrastable, Highly Luminescent Organic-Inorganic Perovskite-Polymer Composite Films Advanced Materials 2016, 28, 10710-10717.
Wei et al., Strong exciton-photon coupling in microcavities containing new fluorophenethylamine based perovskite compounds Opt. Express Apr. 12, 2012, vol. 20, No. 9, 10399-10405.

* cited by examiner

ELECTROLUMINESCENT DEVICE

CROSS-REFERENCE TO RELATED APPLICATIONS

This application is a National Stage Entry of PCT Patent Application No. PCT/GB2015/053557, filed Nov. 20, 2015 and entitled "Electroluminescent Device," which claims priority to Great Britain Patent Application No. 1421133.8, filed Nov. 28, 2014. The foregoing applications are incorporated herein by reference in their entireties.

FIELD OF THE INVENTION

This invention relates to a solid state light-emitting device and in particular to a perovskite-based light-emitting diode, a perovskite-based emissive phosphor and related fabrication methods.

BACKGROUND TO THE INVENTION

In its most basic form a light emitting diode (LED) comprises a light emitting layer which is positioned between an anode and a cathode. A hole injection layer may be incorporated between the anode and the light emitting layer (also known as the active or emissive layer). It functions to decrease the energy difference between the work function of the anode and the valence band or highest occupied molecular orbital (HOMO) of the light emitting layer, thereby increasing the number of holes introduced into the light emitting layer. Broadly speaking, in operation, holes are injected through the anode, and if present the hole injection layer, into the active layer, and electrons are injected into the active layer through the cathode. The holes and electrons combine in the light emitting layer radiatively to provide light. Equivalently, an electron injection layer between cathode and light-emitting layer can play the same role in controlling the injection of electrons into the light-emitting layer. A further role for these injection layers is to confine carriers within the device, so that under forward electric bias, electrons injected from the cathode into the light-emitting layer are significantly prevented from leaving this layer via the hole-injecting layer, and equivalently, holes injected into the light-emitting layer from the anode are significantly prevented from leaving this layer via the electron-injecting layer.

Some devices also incorporate a thin polymer interlayer between the hole injection layer and the light emitting layer. This plays an important role in improving the device efficiency and the lifetime of LEDs. For example, with an interlayer, blue light-emitting polymer organic light-emitting diodes (LEP OLEDs) with an external quantum efficiency of greater than 5% can be achieved, which is 35% higher than without the interlayer. It is believed that this may be due to the prevention of exciton quenching at the hole injection layer/light emitting layer interface.

Over the past two decades, solid state light-emitting devices based on direct bandgap semiconductors have been utilized as energy efficient sources of lighting. However, the fabrication of these devices typically relies on expensive high temperature and high vacuum processes, such as molecular beam epitaxy or thermal sublimation, rendering them uneconomical for use in large area displays.

Solution processing of luminescent semiconductors presents a particularly attractive option for the low-cost fabrication of light-emitting devices [see Burroughes et al. Nature 347, 539-541 (1990); Greenham et al, Nature 365, 628-630 (1993); Colvin et al, Nature 370, 354-357 (1994); and Coe et al, Nature 420, 800-803 (2002)]. Recent work on high-efficiency organometal halide perovskite photovoltaics has shown these materials to possess both the remarkable qualities of traditional semiconductors and the facile processability of organic semiconductors [Lee et al, Science 338, 643-647, doi:10.1126/science.1228604 (2012); Burschka et al., Nature 499, 316-319, doi:10.1038/nature12340 (2013); Liu et al., Nature 501, 395-398, doi:10.1038/nature12509 (2013); Stranks, et al., Science 342, 341-344, doi:10.1126/science.1243982 (2013); and Ball et al, Energy & Environmental Science 6, 1739-1743, doi:10.1039/c3ee40810h (2013)]. Further prior art can be found in, e.g. JP 2008-227330 A.

The semiconducting perovskite materials benefit from low cost and earth-abundance, and can be deposited at low temperatures under ambient conditions. More recently, bright and colour-controlled electroluminescence was reported in perovskite light-emitting diodes (PeLED), thereby opening up a potential range of display and lighting applications for these materials [see Tan, Z.-K. et al., Nat Nano 9, 687-692, doi:10.1038/nnano.2014.149 (2014)]. However, the quantum efficiencies in these devices remain modest due to difficulties in the formation of uniform thin films.

Light emission occurs when injected electrons and holes meet in the perovskite layer and recombine radiatively. However, it is easy for injected charges to bypass the semiconducting perovskite layer through pinholes in the thin films, leading to non-radiative current losses and a lower efficiency. Difficulties in the formation of uniform and pinhole-free semiconducting perovskites are well known, due to the material's crystalline nature. This problem is further exacerbated by the sublimation of excess methylammonium halide precursor during thermal annealing, thereby leaving voids in the perovskite layer. An established technique to overcome this problem involves sequential or vapor deposition of the perovskite precursors [see Liu et al above and Chen, Q. et al., Journal of the American Chemical Society 136, 622-625, doi:10.1021/ja411509g (2013)], although these methods only improve film formation and cannot completely eliminate pinholes.

There is therefore a need to provide an improved method for the preparation of semiconducting perovskite nanoparticle films which address this problem of the formation of pinholes in the films. The provision of such films will enable the manufacture of improved solid state light-emitting devices and other devices, e.g., solar cells, in which semiconducting perovskite films can be incorporated as a semiconductor. The luminescent nature of such films also makes them useful for emissive phosphors applications.

SUMMARY OF THE INVENTION

The applicant has found that the problems of current leakage through perovskite films due to pinhole formation can be overcome through the embedding of semiconducting perovskite nanoparticles in a material that has a wider band gap than the semiconducting perovskite nanoparticles.

Thus, in a first aspect of the present invention there is provided a method for the preparation of a thin layer of semiconducting perovskite nanoparticles embedded in a matrix or blend of a material that has a wider band gap than the semiconducting perovskite nanoparticles, the method comprising blending a solution of a semiconducting perovskite material or a precursor therefor with a solution of a material that has a wider band gap than the semiconducting perovskite material or a precursor therefor followed by removal of the solvent from the mixture thus formed, to give said semiconducting perovskite nanoparticles embedded in a matrix or blend of the material that has a wider band gap than the semiconducting perovskite nanoparticles.

The semiconducting perovskite nanoparticles form in situ when a blend of semiconducting perovskite precursor and material having a wider band gap than the semiconducting perovskite nanoparticles is deposited. The uniformly distributed perovskite nanoparticles provide good light emission, while the material having a wider band gap than the perovskite nanocrystals fills in the surrounding voids to block non-radiative current losses.

In a second aspect of the present invention there is provided a thin layer of semiconducting perovskite nanoparticles embedded in a matrix or blend of a material that has a wider band gap than the semiconducting perovskite nanoparticles.

In a third aspect of the present invention, there is provided a thin layer of semiconducting perovskite nanoparticles embedded in a matrix or blend of a material that has a wider band gap than the semiconducting perovskite nanoparticles prepared according to the method according to the first aspect of the present invention.

In a fourth aspect of the present invention, there is provided a solid state light-emitting device comprising: a first electrode coupled to a first charge injecting layer; a second electrode coupled to a second charge injecting layer; an emissive layer comprising a semiconducting perovskite material, wherein the emissive layer is provided between the first and second charge injecting layers; wherein the semiconducting perovskite material comprises a thin layer of semiconducting perovskite nanoparticles embedded in a matrix or blend of a material that has a wider band gap than the semiconducting perovskite nanoparticles according to the second aspect of the present invention.

In a fifth aspect of the present invention, there is provided a solid state light-emitting device comprising: a first electrode coupled to a charge injecting layer; a second electrode; an emissive layer comprising a semiconducting perovskite material, wherein the emissive layer is provided between the charge injecting layer and the second electrode; and wherein the semiconducting perovskite material comprises a thin layer of semiconducting perovskite nanoparticles embedded in a matrix or blend of a material that has a wider band gap than the semiconducting perovskite nanoparticles according to the second aspect of the present invention.

In a sixth aspect of the present invention, there is provided a method of manufacturing a solid state light-emitting device according to the fourth aspect of the present invention, the method comprising: providing a first electrode on a substrate; depositing a first conducting layer over the first electrode; depositing an emissive semiconducting perovskite layer over the first conducting layer; depositing a second conducting layer over the emissive semiconducting perovskite layer; and depositing a second electrode over the second conducting layer; wherein the semiconducting perovskite layer comprises semiconducting perovskite nanoparticles embedded in a matrix or blend of a material that has a wider band gap than the semiconducting perovskite nanoparticles prepared by blending a solution of a semiconducting perovskite material or a precursor therefor with a solution of a material that has a wider band gap than the semiconducting perovskite nanoparticles or a precursor therefor, depositing the mixture thus formed on the first conducting layer followed by removal of the solvent from the mixture thus formed, to give the desired semiconducting perovskite nanoparticles embedded in the matrix or blend of the material that has a wider band gap than the semiconducting perovskite nanoparticles.

In a seventh aspect of the present invention, there is provided an electronic device comprising an LED display, wherein the display comprises light-emitting devices according to the fourth or fifth aspect of the invention or prepared according to the method of the sixth aspect of the invention.

In an eighth aspect of the present invention, there is provided the use of an insulating material to fill voids in semiconducting perovskite films to prevent non-radiative current losses and reduced efficiency of the semiconducting perovskite films when used in solid state light-emitting devices.

In a ninth aspect of the present invention, there is provided the use of a semiconducting organic insulating material selected from a polymer and a small organic molecule for the preparation of a matrix comprising semiconducting perovskite nanoparticles.

In a tenth aspect of the present invention, there is provided the use of the matrix prepared according to the ninth aspect of the present invention to facilitate exciton energy transfer to the semiconducting perovskite nanoparticles embedded in the matrix to promote electroluminescence.

In an eleventh aspect of the present invention, there is provided the use of a matrix or blend of an insulating material for the control of the wavelengths emitted by a solid state light-emitting device according to the third aspect or the fourth aspect of the present invention by varying the ratio of the insulating material or a precursor therefor to the semiconducting perovskite material or a precursor therefor in the formation of the emissive layer of the solid state light-emitting device.

In an twelfth aspect of the present invention, there is provided the use of a thin layer of semiconducting perovskite nanoparticles embedded in a matrix or blend of a material that has a wider band gap than the semiconducting perovskite nanoparticles according to the second aspect of the present invention in the preparation of an emissive phosphor.

Preferred embodiments are defined in the appended dependent claims.

BRIEF DESCRIPTION OF THE DRAWINGS

The invention is diagrammatically illustrated, by way of example, in the accompanying drawings, in which.

DETAILED DESCRIPTION

Figure 1A:
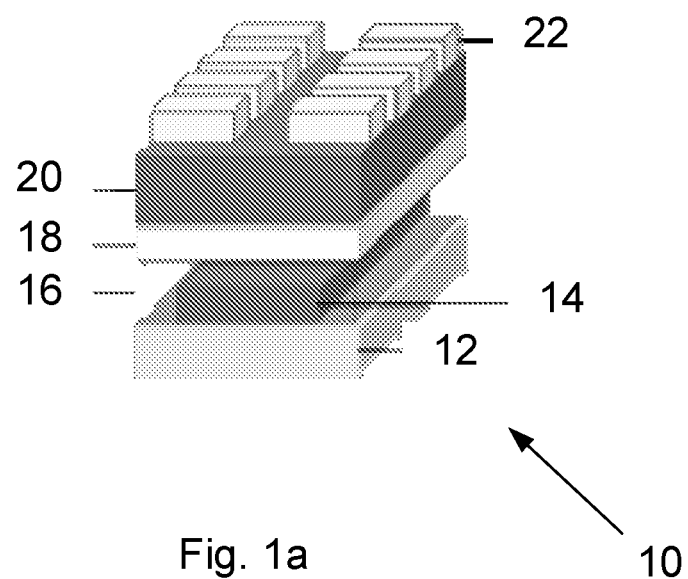
FIG. 1a shows a device architecture comprising $CH_3NH_3PbBr_3$ perovskite, according to an embodiment of the invention.

The method of the first aspect of the present invention provides a solution to the problem of pinhole formation in semiconducting perovskite films. The process of the first aspect of the present invention enables the preparation by means of solution deposition of thin layer of semiconducting perovskite nanoparticles embedded in a matrix or blend of a material that has a wider band gap than the semiconducting perovskite nanoparticles. The material having a wider band gap than the semiconducting perovskite nanoparticles forms a pinhole-free charge-blocking layer, while still allowing, for example, the embedded perovskite crystals to form electrical contact with electron- and hole-injection layers in one form of light emitting diode. This modified structure reduces non-radiative current losses and improves quantum efficiency. This simple technique provides an alternative route to circumvent film formation problems in semiconducting perovskite optoelectronics, and offers the possibility of flexible and high-performance light-emitting displays.

In the following, references to the present invention refer to all aspects of the present invention unless specifically stated to the contrary.

The semiconducting perovskite nanoparticles of the present invention are preferably semiconducting perovskite nanocrystals.

In the context of the present invention, the material in which the semiconducting perovskite nanoparticles are embedded is a material which has a wider band gap than that of the semiconducting perovskite nanoparticles. As a consequence of this, any charges that have previously been able to pass through the semiconducting perovskite film as a result of non-radiative charge leakage through pinholes in the film are prevented by the band gap barrier thus provided. Preferably, the material which has a wider band gap than that of the semiconducting perovskite nanoparticles has a band gap that is greater than 1.5 eV, e.g. greater than 2 eV, greater than 2.5 eV or greater than 2.8 eV.

The material that has a wider band gap than the semiconducting perovskite nanoparticles is suitably an insulating material or a semiconducting material. Preferably it is an insulating material selected from an insulating polymer, an insulating small organic molecule and an insulating inorganic material, more preferably an insulating polymer or an insulating small organic molecule. In one embodiment, the insulating polymer or the insulating small organic molecule is a polar polymer or a polar small organic molecule. The insulating material may also be a semiconductor.

In one preferred embodiment of the present invention, the insulating material is a polyimide. The polyimide may be, for example, the polyamic acid of benzophenone tetracarboxylic dianhydride 4,4-oxydianiline m-phenylenediamine polymer (PIP) having the following formula:

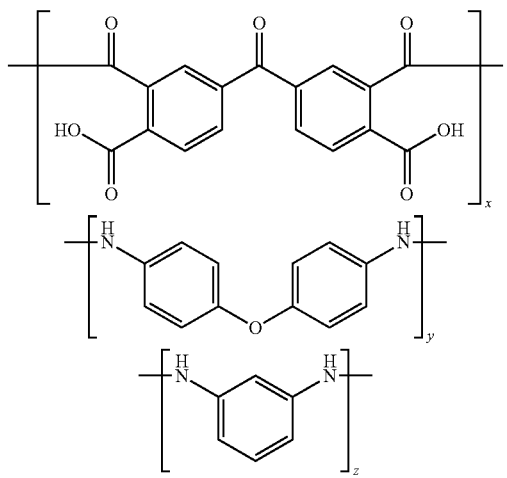

In an alternative preferred embodiment of the present invention, the insulating material is polystyrene.

In yet another embodiment of the present invention, the insulating material is poly (9-vinylcarbazole), with the following molecular structure:

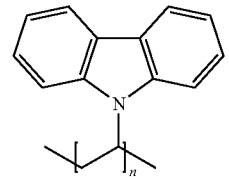

In a further embodiment of the present invention, the insulating material is the small organic compound 4,4-bis(N-carbazolyl)-1,1-biphenyl, with the following molecular structure:

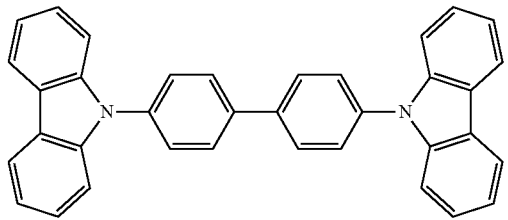 [SMILES: c1ccc2c(c1)c1ccccc1n2-c1ccc(-c2ccc(-n3c4ccccc4c4ccccc43)cc2)cc1]

In an alternative embodiment of the present invention, the insulating material is alumina.

In the present invention, the semiconducting perovskite is preferably a semiconducting perovskite material having the formula $AMX_3$ wherein A, M and X can be any suitable balancing combination of catonic and anionic species; and more preferably it is an organometal halide perovskite material.

In one embodiment of the present invention, the preferred organometal halide perovskite has an $AMX_3$ structure, where A is a monovalent cation, M is a divalent cation and X is a halide anion. In $AMX_3$, the following are preferred:
(i) M is a divalent metal cation;
(ii) the divalent metal cation M is tin ($Sn^{2+}$) or lead ($Pb^{2+}$);
(iii) the monovalent cation is a primary, secondary or tertiary ammonium cation $[HNR^1R^2R^3]^+$, wherein each of $R^1$, $R^2$ and $R^3$ may be the same or different and is selected from hydrogen, an unsubstituted or substituted $C_1$-$C_{20}$ alkyl group and an unsubstituted or substituted $C_5$-$C_{18}$ aryl group. Examples of suitable substituents for the alkyl groups are alkoxy groups having from 1 to 20 carbons atoms, hydroxyl groups, mono and dialkylamino groups wherein each alkyl group may be the same or different and has from 1 to 20 carbon atoms, cyano groups, nitro groups, thiol groups, sulphinyl groups, sulphonyl groups and aryl groups having from 5 to 18 carbon atoms. Examples of suitable substituents for the alkyl groups are alkyl groups having from 1 to 20 carbon atoms, alkenyl and alkynyl groups each having from 2 to 20 carbon atoms, alkoxy groups having from 1 to 20 carbons atoms, haloalkyl groups having from 1 to 20 carbon atoms, hydroxyl groups, mono and dialkylamino groups wherein each alkyl group may be the same or different and has from 1 to 20 carbon atoms, cyano groups, nitro groups, thiol groups, sulphinyl groups and sulphonyl groups;
(iv) the monovalent cation is of the form $[R^1R^2N\!\!=\!\!CH\!\!=\!\!NR^3R^4]^+$:

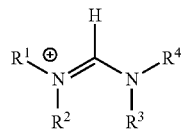

wherein each of $R^1$, $R^2$, $R^3$ and $R^4$ may be the same or different and is selected from hydrogen, an unsubstituted or substituted $C_1$-$C_{20}$ alkyl group and an unsubstituted or substituted $C_5$-$C_{18}$ aryl group. Examples of suitable substituents for the alkyl groups are alkyl groups having from 1 to 20 carbon atoms, alkenyl and alkynyl groups each having from 2 to 20 carbon atoms, alkoxy groups having from 1 to 20 carbons atoms, haloalkyl groups having from 1 to 20 carbon atoms, hydroxyl groups, mono and dialkylamino groups wherein each alkyl group may be the same or different and has from 1 to 20 carbon atoms, cyano groups, nitro groups, thiol groups, sulphinyl groups and sulphonyl groups;
(v) the monovalent cation is of the form $(R^1R^2N)(R^3R^4N)C\!\!=\!\!NR^5R^6$:

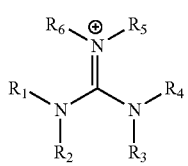

wherein each of $R^1R^2$, $R^3$, $R^4$, $R^5$ and $R^6$ may be the same or different and is selected from hydrogen, an unsubstituted or substituted $C_1$-$C_{20}$ alkyl group and an unsubstituted or substituted $C_5$-$C_{18}$ aryl group. Examples of suitable substituents for the alkyl groups are alkyl groups having from 1 to 20 carbon atoms, alkenyl and alkynyl groups each having from 2 to 20 carbon atoms, alkoxy groups having from 1 to 20 carbons atoms, haloalkyl groups having from 1 to 20 carbon atoms, hydroxyl groups, mono and dialkylamino groups wherein each alkyl group may be the same or different and has from 1 to 20 carbon atoms, cyano groups, nitro groups, thiol groups, sulphinyl groups and sulphonyl groups;
(vi) the monovalent cation is an alkali metal cation;
(vii) the monovalent cation is caesium ($Cs^+$) or rubidium ($Rb^+$);
(viii) X is a halide anion selected from chloride, bromide, iodide, and fluoride and, in the $AMX_3$ structure each halide may be the same or different.

In another embodiment of the present invention, the preferred organometal halide perovskite has an $A_{1-i}B_iMX_3$ structure, wherein:
A and B are each a monovalent cation as defined above, where A and B are different;
M is a divalent metal cation as defined above;
X is a halide anion as defined above; and
i is between 0 and 1.

In a further embodiment of the present invention, the preferred organometal halide perovskite material has an $AMX_{3-k}Y_k$ structure, wherein:
A is a monovalent cation as defined above;
M is a divalent metal cation as defined above;
X and Y are each a halide anion as defined above, where X and Y are different; and
k is between 0 and 3.

In a yet further embodiment of the present invention, the preferred organometal halide perovskite material has an $AM_{1-j}N_jX_3$ structure, wherein:
A is a monovalent cation as defined above;
M and N are each a divalent metal cation as defined above;
X is a halide anion as defined above; and
j is between 0 and 1.

In a further embodiment of the present invention, the preferred organometal halide perovskite material has an $A_{1-i}B_iM_{1-j}N_jX_{3-k}Y_k$ structure, wherein:
A and B are each a monovalent cation as defined above, where A and B are different;
M and N are each a divalent metal cation as defined above;
X and Y are each a halide anion as defined above, where X and Y are different; and
where i is between 0 and 1, j is between 0 and 1, and k is between 0 and 3.

In the present invention, the thickness of the thin layer of semiconducting perovskite nanoparticles embedded in the matrix or blend of the material that has a wider band gap than the semiconducting perovskite nanoparticles is preferably ≤500 nm, and more preferably ≤100 nm.

In the method according to the first aspect of the present invention, an annealing step may be performed after the step to remove the solvent. The solvent may be removed by any suitable means known to the person skilled in the art, e.g. spin coating.

In the present invention, the ratio by weight of semiconducting perovskite nanoparticles to the material that has a wider band gap than the semiconducting perovskite nanoparticles in which the semiconducting perovskite nanoparticles are embedded may for example be from 0.01:1 to 20:1, preferably from 0.1:1 to 10:1, more preferably from 1:1 to 5:1, and most preferably from 1:1 to 2:1.

The method of the present invention produces a thin layer of semiconducting perovskite nanoparticles embedded in a matrix or blend of a material that has a wider band gap than the semiconducting perovskite nanoparticles that is particularly well suited for use in devices that incorporate an emissive semiconducting layer, e.g. the solid state light-emitting devices according to the fourth and fifth aspects of the present inventions.

The applicant has found that by varying the ratio of semiconducting perovskite nanoparticles to the material that has a wider band gap than the semiconducting perovskite nanoparticles in which the perovskite nanoparticles are embedded, it is possible to improve the quantum efficiency dramatically, e.g. the applicant has found that in light emitting diodes prepared according to the invention the external quantum efficiency (EQE) of a device comprising a emissive film according to the present invention increased by more than two orders of magnitude compared to the same device prepared using the same semiconducting perovskite nanoparticles prepared as a film in the absence of the material that has a wider band gap than the semiconducting perovskite nanoparticles. It also resulted in a significantly reduced current density required to achieve the same electroluminescence.

This approach can be applied to use of the same thin layer of semiconducting perovskite nanoparticles embedded in a matrix or blend of a material that has a wider band gap than the semiconducting perovskite nanoparticles in semiconducting perovskite light emitting diodes and solar cells.

The sixth aspect of the present invention provides a method of manufacturing of a solid-state light emitting device according to the fourth aspect of the invention.

In one embodiment of the fourth, fifth and sixth aspects of the present invention, the first electrode is an anode and is formed by the deposition of a transparent conductive material, preferably selected from indium tin oxide (ITO), fluorine doped tin oxide (FTO), indium zinc oxide, graphene, carbon nanotubes, and a metal with a thickness of less than 20 nm, and more preferably indium tin oxide (ITO). In the fourth aspect and sixth aspect of the present invention, the first electrode as anode is deposited on a substrate which is usually formed of a transparent material, preferably glass.

In another embodiment of the fourth, fifth and sixth aspects of the present invention, the emissive semiconducting perovskite layer is composed of semiconducting perovskite nanocrystals embedded in a matrix or a blend of an insulating material selected from an insulating polymer, an insulating small organic molecule and an insulating inorganic compound.

In a further embodiment of the fourth, fifth and sixth aspects of the present invention, the emissive layer has a thickness of ≤500 nm, preferably ≤100 nm.

In a yet further embodiment of the fourth, fifth and sixth aspects of the present invention, a thin insulating layer is deposited between either or both of the charge injecting layers and the light-emitting layer. Preferably, the insulating layer is formed of an oxide or nitride. More preferably the insulating layer is selected from the group consisting of aluminium oxide, silicon dioxide, silicon nitride, zinc oxide, nickel oxide or magnesium oxide. The insulating layer may be deposited by any suitable means, e.g. atomic layer deposition, ALD.

For example, the transparent conductive electrode material may be coated with a thin layer (preferably <30 nm thick) of an insulating layer selected from the group consisting of aluminium oxide, silicon dioxide, zinc oxide, magnesium oxide, nickel oxide and silicon nitride. The thin scaffold or interlayer may improve the luminescence efficiency of the device, by preventing quenching at the interface between the charge injection layer and the emissive perovskite layer, or by preventing electrons or holes from escaping out of the semiconducting perovskite layer.

In a further embodiment of the fourth, fifth and sixth aspects of the present invention, at least one of the first conducting layer and the second conducting layer is formed of a semiconductor material. One of the conducting layers (charge injecting layers) may be a hole injecting organic semiconducting material and may be, for example, selected from the group consisting of PEDOT:PSS, PANI (polyaniline), polypyrole, optionally substituted, and doped poly (ethylene dioxythiophene) (PEDT). One of the conducting layers (charge injecting layers) may be an electron injecting organic semiconducting material and may be, for example, selected from the group consisting of poly(fluorene)s such as F8 and F8-PFB AB copolymer (95:5 F8:TFB).

In one preferred embodiment of the fourth, fifth and sixth aspects of the present invention, a thin layer of <30 nm of a material selected from molybdenum trioxide and tungsten trioxide is deposited between:
the transparent conductive electrode and the semiconducting perovskite layer,
between a charge injecting layer and a conductive electrode,
between the transparent conductive electrode and a charge injecting layer,
between the semiconducting perovskite layer and a charge injecting layer, or
between the semiconducting perovskite layer and a conductive electrode.

This further thin layer may increase the charge injection efficiency between layers of the light-emitting device.

The deposition of each of the layers in the method of the sixth aspect of the invention may be performed using one or more of the following deposition techniques: vacuum thermal evaporation, spin coating, direct-write printing, inkjet printing, lithographic patterning, and solution deposition.

The seventh aspect of the present invention provides an electronic device comprising an LED display, wherein the display comprises light-emitting devices as described above. The electronic device may for example be a consumer electronic device, a mobile device such as smartphone or tablet PC, or a display screen/panel.

The eighth aspect of the present invention is directed to the use of an insulating material to fill voids in semiconducting perovskite films to prevent non-radiative current losses and reduced efficiency of the semiconducting perovskite films when used in solid state light-emitting devices. In particular, the insulating material is preferably an insulating polymer, an insulating small organic molecule and an insulating inorganic material as described and exemplified above.

The ninth aspect of the present invention provides the use of a semiconducting organic insulating material selected from a polymer and a small organic molecule for the preparation of a matrix comprising semiconducting perovskite nanoparticles. Preferred insulating polymers and insulating small organic molecules are as described and exemplified above. The matrix thus prepared can be used to facilitate exciton energy transfer to the semiconducting perovskite nanoparticles embedded in the matrix to promote electroluminescence in accordance with the tenth aspect of the present invention.

The eleventh aspect of the present invention provides the use of an insulating material for the control of the wavelengths emitted by a solid state light-emitting device by varying the ratio of the insulating material or a precursor therefor to the semiconducting perovskite material or a precursor therefor in the formation of the emissive layer of the solid state light-emitting device. The insulating material is preferably an insulating polymer, an insulating small organic molecule and an insulating inorganic material as described and exemplified above. The solid state light-emitting device can be any of the solid state light-emitting devices described and exemplified above according to the fourth and fifth aspects of the present invention or prepared according to the sixth aspect of the present invention. The ratio of insulating material or a precursor therefor to the semiconducting perovskite material or a precursor therefor in the formation of the emissive layer of the solid state light-emitting device may typically be from 0.01:1 to 20:1, preferably 0.1:1 to 10:1, more preferably from 1:1 to 5:1, and most preferably from 1:1 to 2:1.

The twelfth aspect of the present invention provides the use of a thin layer of semiconducting perovskite nanoparticles embedded in a matrix or blend of a material that has a wider band gap than the semiconducting perovskite nanoparticles in the preparation of an emissive phosphor. The thin layer of semiconducting perovskite nanoparticles embedded in a matrix or blend of a material that has a wider band gap than the semiconducting perovskite nanoparticles is as described and exemplified above in the second aspect of the invention. The material that has a wider band gap than the semiconducting perovskite nanoparticles is preferably selected from an insulating organic material selected from an insulating polymer and an insulating small organic molecule, and a blend of alumina nanoparticles, and more preferably a blend of alumina nanoparticles. The ratio by weight of semiconducting perovskite nanoparticles:alumina nanoparticles in this preferred embodiment is typically from 1:10 to 10:1, preferably from 2:1 to 6:1, e.g. 6:1, 4:1 and 2:1.

The applicant has found that blending semiconducting perovskite precursors with a material that has a wider band gap than the semiconducting perovskite nanoparticles, preferably alumina, and depositing them into a film increases the photoluminescence efficiency of the perovskite. Alumina is transparent (in the visible), and does not absorb semiconducting perovskite emission. It can be processed from solution, similar to semiconducting perovskite.

EXAMPLES

FIG. 1a shows device architecture 10 comprising a thin layer of semiconducting perovskite nanoparticles embedded in a polyimide precursor (PIP), according to an embodiment of the invention. The perovskite light-emitting diode (PeLED) 10 is fabricated on a transparent substrate 12, which may be a glass substrate. Generally speaking, the PeLED illustrated here comprises a first electrode 14 coupled to a first charge injecting layer 16, a second electrode 22 coupled to a second charge injecting layer 20, and an active layer 18 formed of organometal halide perovskite nanoparticles embedded in PIP (e.g. a $CH_3NH_3PbBr_3$:PIP layer). The active layer 18 is sandwiched between the first and second charge injecting layers 16, 20. One or both of the charge injecting layers 16, 20 may be formed of a semiconductor material.

Preferably, the first electrode 14 is formed of a transparent, conductive material, such as indium tin oxide (ITO). One or both of the first and second charge injecting layers 16, 20 may actively inject charge into the active perovskite layer 18, or one or both of layers 16, 20 may simply act as a charge transport and charge blocking layer. The second electrode 22 is formed of any conductive material such as, but not limited to $MoO_3$/Ag, Ca/Ag, Au etc.

For illustrative purposes, the visible light emitting PeLED device 24 is fabricated using an ITO/PEDOT:PSS/$CH_3NH_3PbBr_3$:PIP/F8/Ca/Ag architecture. Thus, here, the first charge injecting layer 16 is formed from a conductive polymer material, such as poly(3,4-ethylenedioxythiophene)-poly(styrenesulfonate) (PEDOT:PSS), and the second charge injecting layer 20 is formed from poly(9,9'-dioctylfluorene) (F8). The PIP polymer generally has a larger bandgap than the semiconducting perovskite nanoparticles. In this structure, the injected charges are confined within the active layer 18 by providing the charge injecting layers 16, 20 from a material that has a large bandgap relative to the bandgap of the perovskite layer. Additionally, confinement of the injected charges (holes and electrons) within the active (emissive) perovskite layer may be improved further by forming the PeLED with a thin active perovskite layer, e.g. having a thickness of less than 100 nm (or <60 nm, or even <20 nm).

Figure 1B:
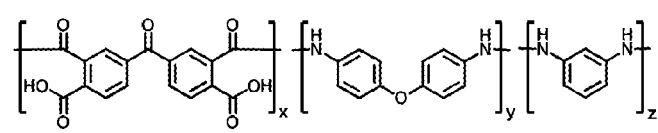
FIG. 1b shows the chemical structure of PI2525 polyimide precursor (PIP)
Figure 1C:
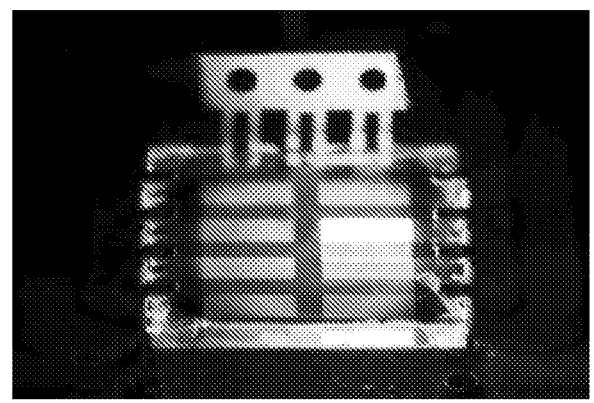
FIG. 1c shows an image of a $CH_3NH_3PbBr_3$/PIP PeLED according to the present invention.

A large-bandgap perovskite, $CH_3NH_3PbBr_3$, was used as a green emitter. The perovskite precursors are mixed with a commercial aromatic polyimide precursor (PIP). FIG. 1b shows the chemical structure of a PI2525 polyimide precursor (PIP). This polymer was chosen for its polar functional groups, which are likely to associate well with the hybrid perovskite. The perovskite nanocrystal and PIP polymer composite forms upon spin-coating and mild annealing, although the polymer remains in its unreacted precursor form under these processing conditions. The perovskite crystals form well, even in the presence of a polymer matrix, as confirmed by x-ray diffraction studies. FIG. 1e shows X-ray diffraction data of films spin-coated on quartz substrate under different PIP/perovskite blending ratios. The crystal size of perovskite-only and PIP/perovskite 1/10 w/w films cannot be determined because of instrumental broadening. The estimated crystal size for PIP/perovskite 1/2 w/w is 70 nm.

Here, ITO is the anode (electrode 14) and is coupled to the first charge injecting layer 16, which may be formed from PEDOT:PSS and is used to inject holes into the active perovskite layer 18. The second electrode 22 is the cathode and may be formed from silver/calcium.

The second electrode 22 is coupled to the second charge injecting layer 20, which may be formed from a poly(9,9'-dioctylfluorene) (F8) polymer semiconductor material. The F8 material serves as a spacer layer for electron transport and to prevent emission quenching near the interface with the second electrode 22 (rather than actively injecting charge into the perovskite layer). The F8 material serves as the electron-transporting layer 20, blocks injected holes from leaving the device 10, and also serves as a spacer layer to prevent luminescence quenching at the metal electrode 22. In addition, the semiconducting F8 layer 20 forms a good conformal coating and prevents the top electrode 22 from shorting through the thin (<50 nm) perovskite layer 18. The low-workfunction calcium electrode 22 provides ohmic electron injection, while the high-workfunction PEDOT:PSS acts as the hole-injection layer 16.

Figure 1D:
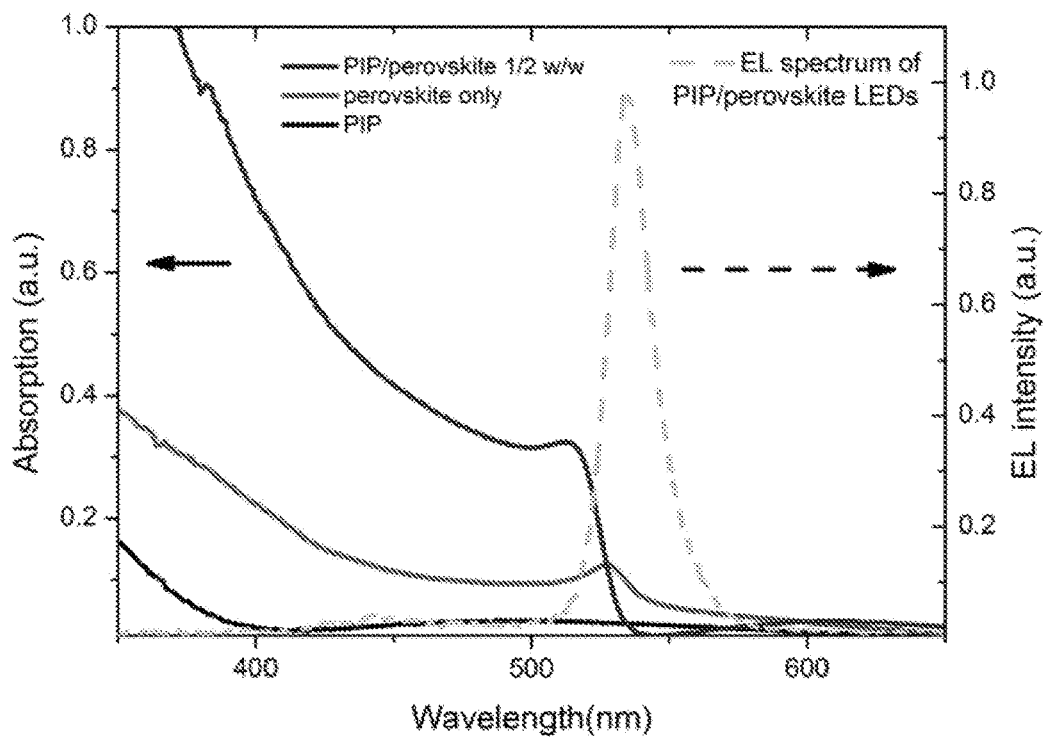
FIG. 1d shows the absorption spectra of PIP, $CH_3NH_3PbBr_3$ and blend film, and electroluminescence spectrum (dashed line) of $CH_3NH_3PbBr_3$/PIP PeLED.
Figure 1E:
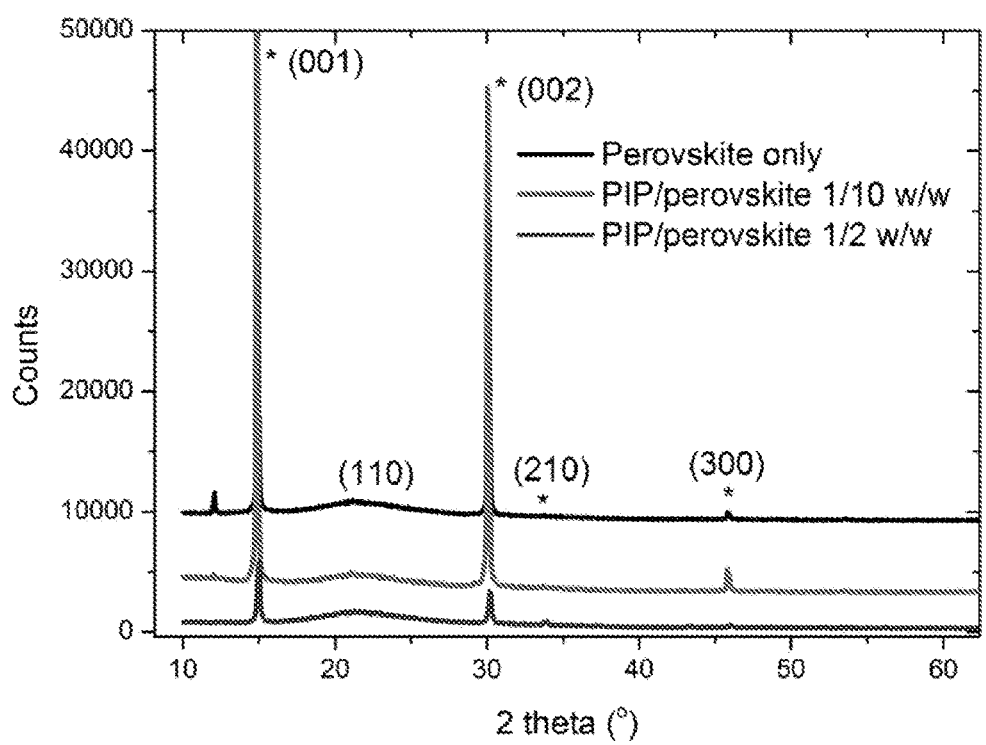
FIG. 1e shows X-ray diffraction data of films spin-coated on quartz substrate under different PIP/perovskite blending ratios.

FIG. 1d shows the absorption spectra of PIP, $CH_3NH_3PbBr_3$ and blend films, and the electroluminescence spectrum (dashed line) of the CH$_3$NH$_3$PbBr$_3$/PIP PeLED shown in FIG. 1a. As shown in FIG. 1d, a strong green electroluminescence was observed at 529 nm, with a narrow full width at half maximum (FWHM) of 19 nm. The PIP polymers absorb only in the UV and do not interfere with the green emission from the perovskite. FIG. 1c shows an image of CH$_3$NH$_3$PbBr$_3$/PIP PeLED, in an embodiment of the invention. As shown in FIG. 1c, electroluminescence is uniform across the entire device pixel with no signs of spotting, demonstrating that the perovskite nano-crystals are uniformly distributed across the spin-coated film.

Figure 2A:
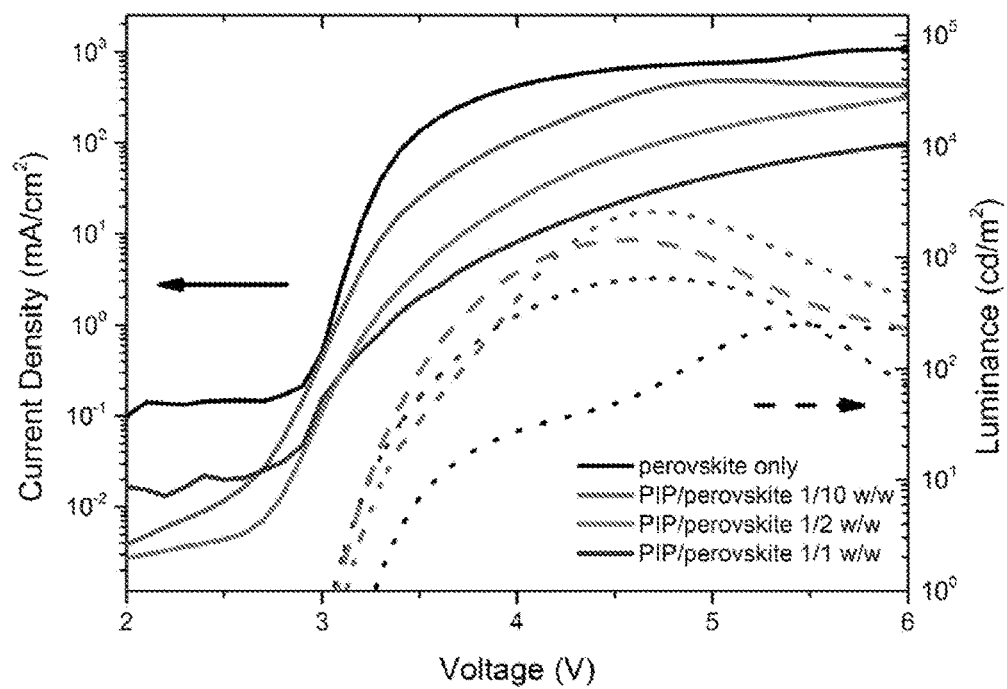
FIG. 2a shows a graph of combined current density (solid line) vs. voltage and luminance (dashed line) vs. voltage characteristics of PeLEDs in an embodiment of the invention.
Figure 2B:
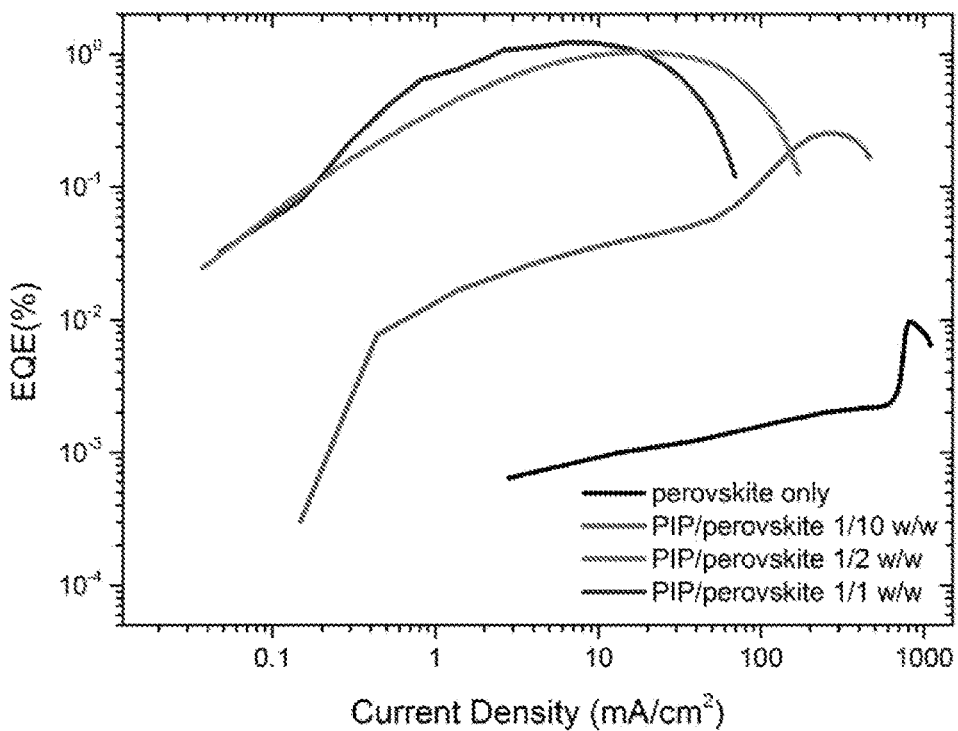
FIG. 2b shows a graph of external quantum efficiency vs. current density characteristics of PeLEDs in an embodiment of the invention.

To determine the effectiveness of the perovskite:PIP polymer composite as an emissive active layer, light-emitting diodes with a range of PIP to perovskite weight ratios were fabricated. FIG. 2a shows the combined luminance and current density versus voltage characteristics of devices with PIP:perovskite ratios of 1:10, 1:2 and 1:1 as well as a control device with no PIP added. FIG. 2b shows the corresponding external quantum efficiency (EQE) of the respective devices. The devices show a clear trend of increased quantum efficiency with the addition of PIP. In particular, the EQE increased by more than 2 orders of magnitude, from 0.010% in devices without PIP, to 1.2% in devices with a 1:1 PIP to perovskite ratio. This corresponds to an internal quantum efficiency (IQE) of 5.4%, assuming a Lambertian emission profile. This dramatic enhancement in efficiency is mostly led by a decrease in current density required for electroluminescence. For instance, in the 1:2 ratio device, a current density of 3.1 mA cm$^{-2}$ is required to produce a luminance of 200 cd m$^{-2}$, but much larger current densities of 580 mA cm$^{-2}$ and 57 mA cm$^{-2}$ are required for the perovskite-only and the 1:10 ratio devices respectively to achieve the same luminance.

Figure 2C:
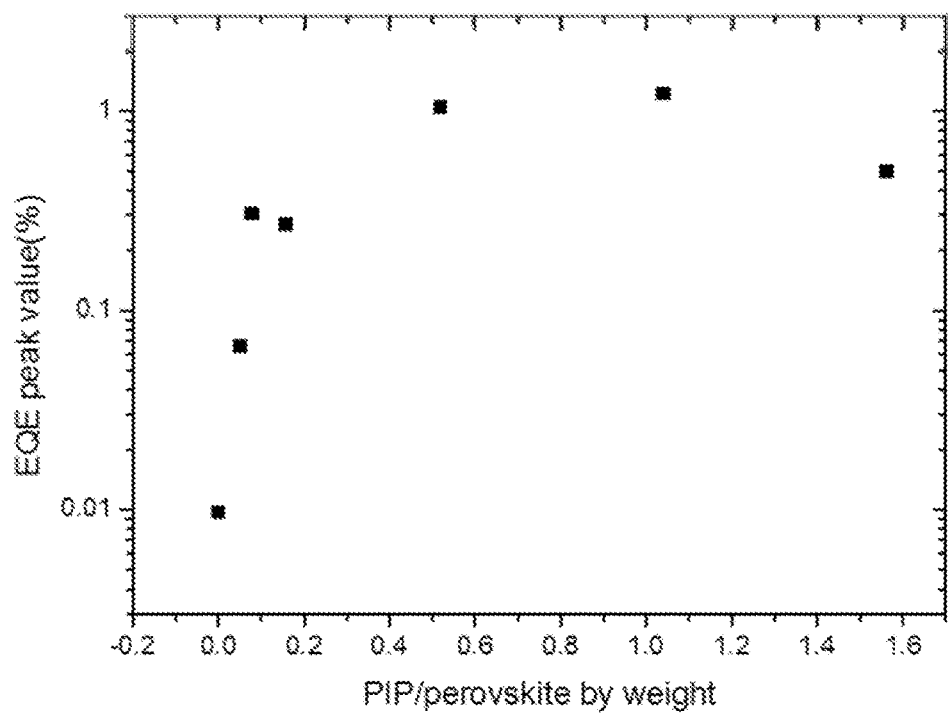
FIG. 2c shows a graph of external quantum efficiency peak value vs. PIP/CH$_3$NH$_3$PbBr$_3$ weight ratio in an embodiment of the invention.

The PIP and perovskite composite devices were investigated over a wider range of mixing ratios—the device performances are shown in FIG. 2c. The best EQE of ~1% is achieved between a 1:2 and 1:1 PIP to perovskite ratio. This represents a 10-fold enhancement of device efficiency over those reported in earlier studies. The device efficiency drops at higher ratios, and some device pixels fail to work at these ratios, suggesting that the emissive layer has become too resistive with such high polymer content.

Through scanning electron microscope studies of films of different ratios, we have been able to deduce that the perovskite nano-crystals form within a matrix of dielectric PIP in the blend films, and the insulating PIP polymer serves to block the electrical shunting paths. The thickness of the PIP polymer was determined to be 3 nm and 30 nm in the 1:10 and 1:2 ratio PIP:perovskite films, respectively. The thicker 1:2 ratio film provides superior PIP coverage and therefore leads to minimal current losses and a significantly enhanced device efficiency. The polymer coverage in the 1:10 ratio films is thinner and possibly incomplete in some areas, and therefore provides less protection against current losses. Since the perovskite and PIP composite devices emit efficiently and uniformly up to a 1:1 blend ratio, it is reasonable to assume that the perovskite nano-crystals extend across the thickness of these films, forming electrical contact with both the PEDOT:PSS and the F8 layers.

Figure 3:
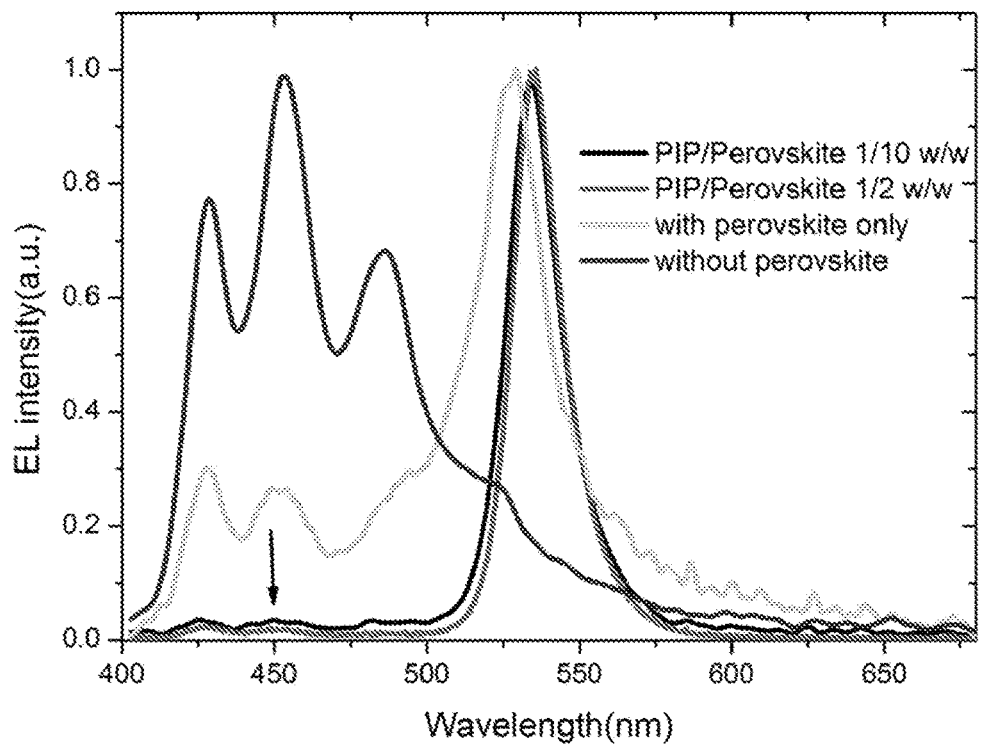
FIG. 3 shows electroluminescence spectra of F8 LED, perovskite-only and PIP/perovskite blend LEDs, taken at 5V bias.

FIG. 3 shows electroluminescence spectra of F8 LED, perovskite-only and PIP/perovskite blend LEDs, taken at 5V bias. The charges that meet and recombine in the perovskite-covered regions produce green light emission. However, in the spaces between the perovskite crystals, the charges are either lost at the exposed F8/PEDOT:PSS interface, or are blocked by the PIP dielectric polymer in the composite films. Recombination of charges in F8 could lead to F8 electroluminescence. Indeed, in the perovskite-only device, an F8 contribution to electroluminescence could be observed between 400 nm and 500 nm, as shown in FIG. 3. This F8 electroluminescence is completely shut off in the PIP-containing devices and a clean perovskite emission is obtained, further demonstrating that the PIP is remarkably effective in blocking the shunting paths at the F8/PEDOT:PSS interface.

Size Tunablility of the Perovskite Nanocrystals Formed in an Organic Matrix

In embodiments, it is possible to tune the properties of the perovskite layer in a light-emitting diode or an emissive phosphor by altering the size of the nanocrystals formed in the organic matrix. For example, it is desirable to tune the emission wavelength (colour) of emissive phosphors.

Scanning electron microscopy (SEM) images of CBP:perovskite samples (CH$_3$NH$_3$PbBr$_3$ perovskite nanocrystals in 4,4-Bis(N-carbazolyl)-1,1-biphenyl (CBP) matrix) mixed at weight ratios ranging from 1:1 to 15:1 (CBP:perovskite), show that the relatively bright regions in the images correspond to CH$_3$NH$_3$PbBr$_3$ perovskite (Pe), while the darker regions correspond to the CBP matrix. The contrast of the two materials is due to the difference in their conductivities. When the weight concentration of perovskite is 50% (CBP:Pe=1:1), the perovskite material forms a connected network, enclosing isolated islands of CBP. The mean width of the perovskite clusters is about 280 nm. In contrast, for a sample having CBP:Pe=15:1 (i.e. a lower amount of perovskite material embedded within the matrix), the average size of the perovskite nanocrystal domains is approximately 50 nm. Each perovskite nanocrystal domain is formed by many smaller nanocrystals.

Figure 4A:
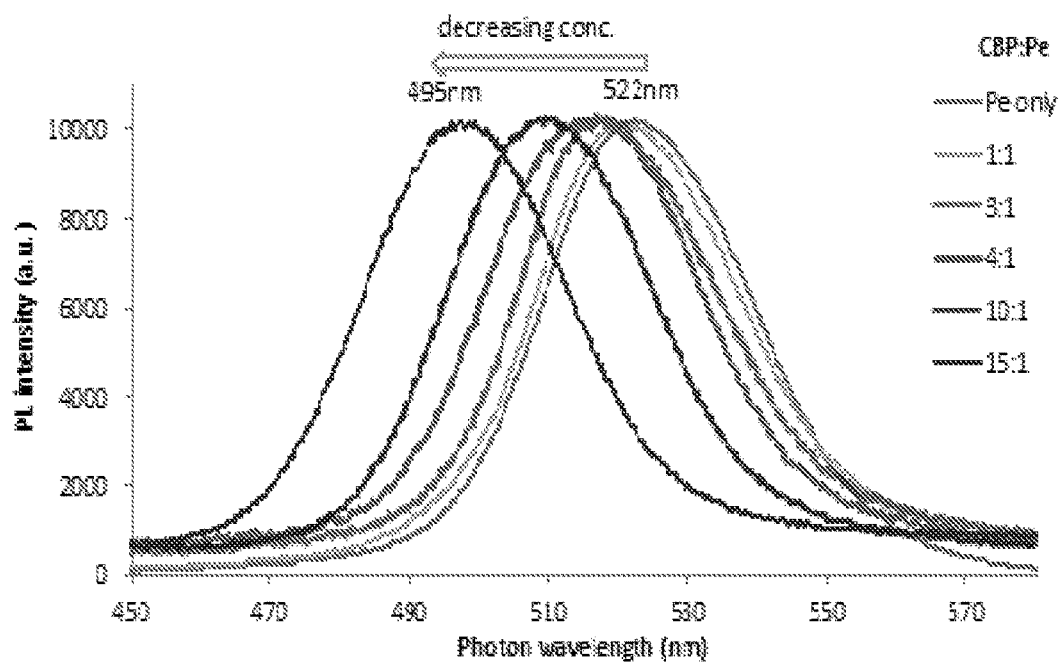
FIG. 4a shows photoluminescence spectra of samples with perovskite nanocrystals in CBP matrix (with varying weight ratios)

FIG. 4a shows photoluminescence spectra of samples with perovskite nanocrystals in a CBP matrix (with varying weight ratios). In particular, the spectra show the photoluminescence (PL) spectra of CH$_3$NH$_3$PbBr$_3$ perovskite nanocrystals embedded in a 4,4-Bis(N-carbazolyl)-1,1-biphenyl (CBP) matrix. The samples were optically excited by a 407 nm laser during the measurement. The PL spectrum of a bulk (pristine) perovskite thin-film is shown as the red curve. The peak of the emission shifts to shorter wavelength as the concentration (and size) of perovskite in CBP matrix decreases.

Figure 4B:
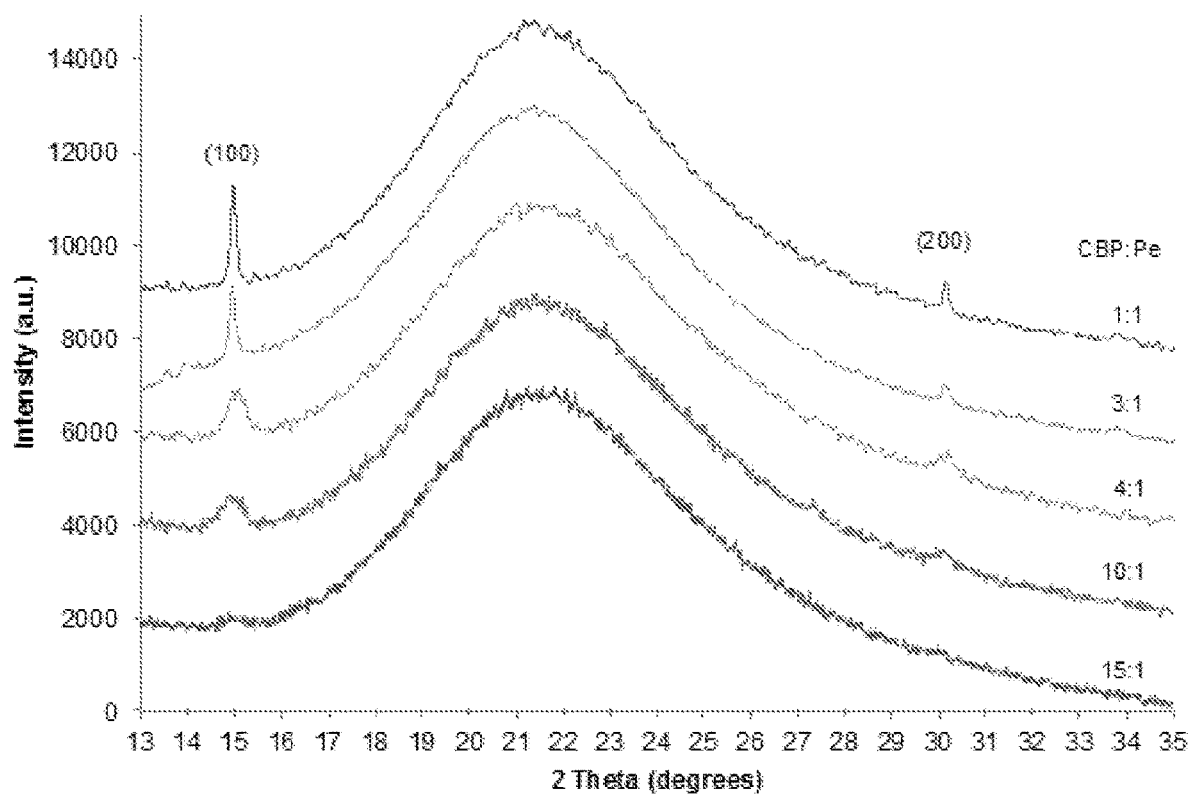
FIG. 4b shows X-ray diffraction patterns of CBP:CH$_3$NH$_3$PbBr$_3$ perovskite thin-films with various CBP:Pe weight ratios. The broadening of the (100) and (200) crystalline peaks indicates the formation of smaller nanocrystals.

FIG. 4b shows X-ray diffraction patterns of CBP:CH$_3$NH$_3$PbBr$_3$ perovskite thin-films with various CBP:Pe weight ratios. The broadening of the (100) and (200) crystalline peaks indicates the formation of smaller nanocrystals. The X-ray diffraction results shown in FIG. 4b, reveal that the average size of the perovskite nanocrystal is about 76 nm for the sample having CBP:Pe=1:1, and about 10.5 nm for the sample with CBP:Pe=15.1. Thus, experiments show that as the concentration of perovskite decreases, the perovskite materials form nanocrystals with decreasing sizes.

Figure 5A:
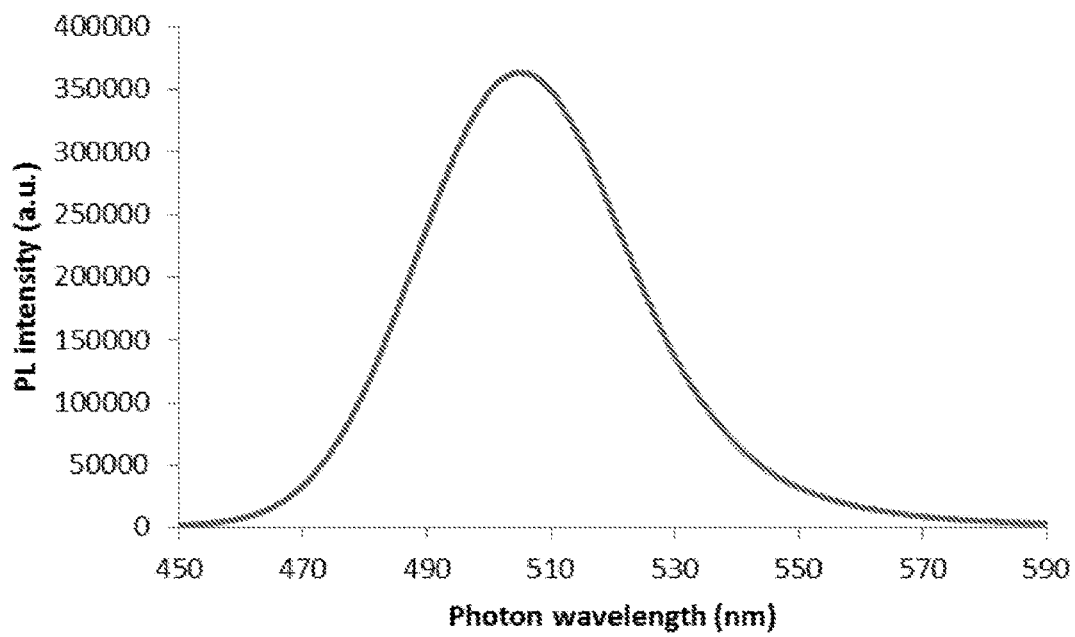
FIG. 5a shows photoluminescence spectrum of CH$_3$NH$_3$PbBr$_3$ perovskite nanocrystals embedded in a PS matrix (PS:Pe=10:1 weight ratio)
Figure 5B:
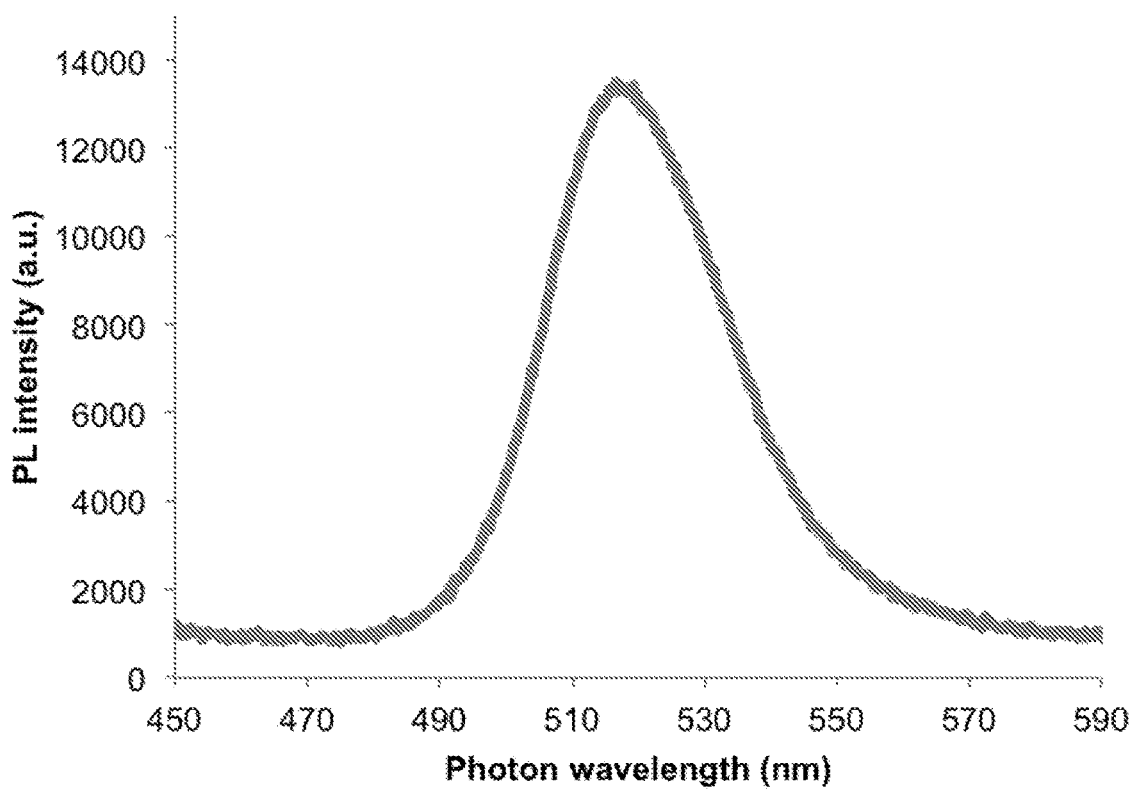
FIG. 5b shows photoluminescence spectrum of CH$_3$NH$_3$PbBr$_3$ perovskite nanocrystals embedded in a PVK matrix (PVK:Pe=3:1 weight ratio)

Perovskite nanocrystals formed in other polymer materials have also been investigated, to determine further methods of tuning the photoluminescence properties of the perovskite nanocrystals. For example, CH$_3$NH$_3$PbBr$_3$ perovskite nanocrystals were embedded in an polystyrene (PS) matrix (PS:Pe=10:1 weight ratio). Scanning electron microscope (SEM) images reveal that the average size of the nanocrystal domains was approximately 180 nm. FIG. 5a shows the photoluminescence spectrum of CH$_3$NH$_3$PbBr$_3$ perovskite nanocrystals embedded in a PS matrix (PS:Pe=10:1 weight ratio). Perovskite nanocrystals were also formed in a conjugated polymer matrix, e.g. CH$_3$NH$_3$PbBr$_3$ perovskite nanocrystals in a poly(9-vinylcarbazole) (PVK) matrix. FIG. 5b shows the photoluminescence spectrum of $CH_3NH_3PbBr_3$ perovskite nanocrystals embedded in a PVK matrix (PVK:Pe=3:1 weight ratio). Thus, it is clear that the matrix in which the perovskite nanocrystals are embedded can affect the photoluminescence.

For FIGS. 5a and 5b, the $CH_3NH_3PbBr_3$ perovskite precursor solution was prepared by mixing $CH_3NH_3Br$ and $PbBr_2$ at a molar ratio of 3:1 in anhydrous N,N-dimethylformamide (DMF) to give a weight concentration of 20%. The solution was further diluted in DMF to give a concentration of 10 mg/ml. The solution was stirred for 24 hours before further processing.

4,4-Bis(N-carbazolyl)-1,1-biphenyl (CBP) was dissolved in DMF to a concentration of 10 mg/ml. Polystyrene (PS) was dissolved in DMF to a concentration of 20 mg/ml. Poly(9-vinylcarbazole) (PVK) was dissolved in DMF to a concentration of 10 mg/ml. The solutions were stirred for 24 hr before further processing.

The $CH_3NH_3PbBr_3$ perovskite precursor solution and the matrix material solutions were mixed at various volume ratios to achieve the weight ratios described in the examples above. The mixtures were stirred under 70° C. for 2 hours and were spun-cast onto pre-cleaned quartz substrates in a $N_2$ purged glovebox to obtain a film thickness of about 50 nm. The thin-films were then annealed at 90° C. for 5 min to accelerate solvent evaporation and crystallisation.

Perovskite Nanoparticles for Use in an Emissive Phosphor

We have described above how the properties of perovskite nanoparticle films can be tuned to alter the emission wavelengths, and how the tuning techniques can be used to provide tunable emissive phosphors. The possibility of using alumina nanoparticle/perovskite as an emissive phosphor has been investigated. In embodiments, perovskite precursors are blended with alumina, and deposited into a film which increases the luminescence efficiency of the perovskite. Alumina is transparent (in the visible spectrum), and does not absorb perovskite emission. Alumina can be processed from solution, similar to perovskite, which may simplify the production of an emissive phosphor.

Figure 6:
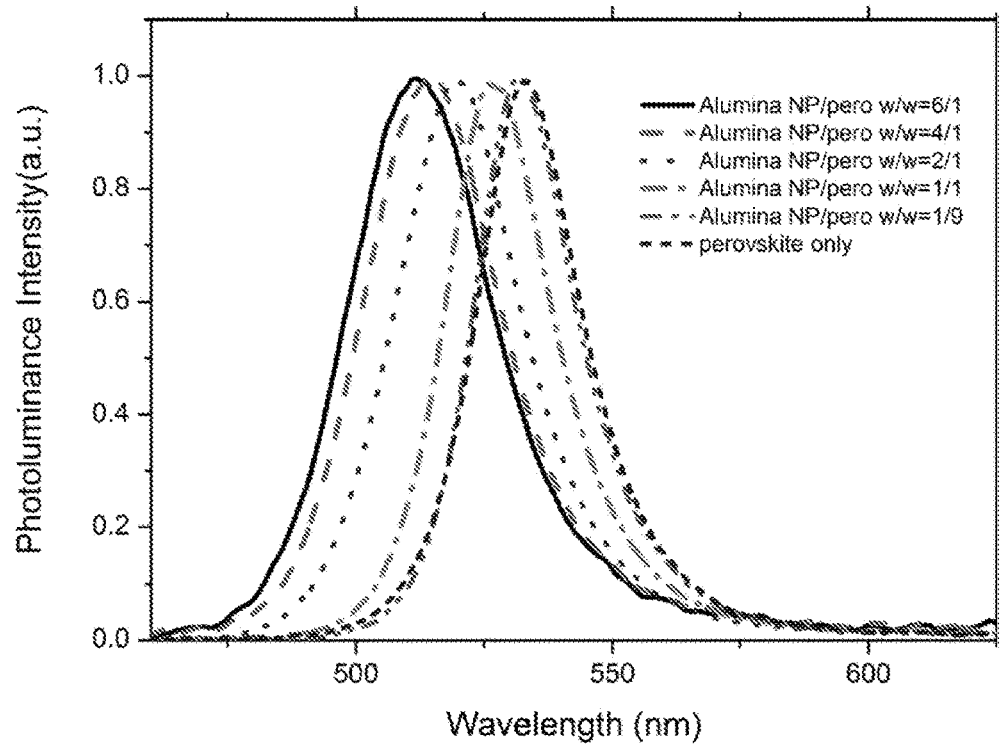
FIG. 6 shows photoluminance spectrum of alumina nanoparticle/perovskite composite films.
Figure 7:
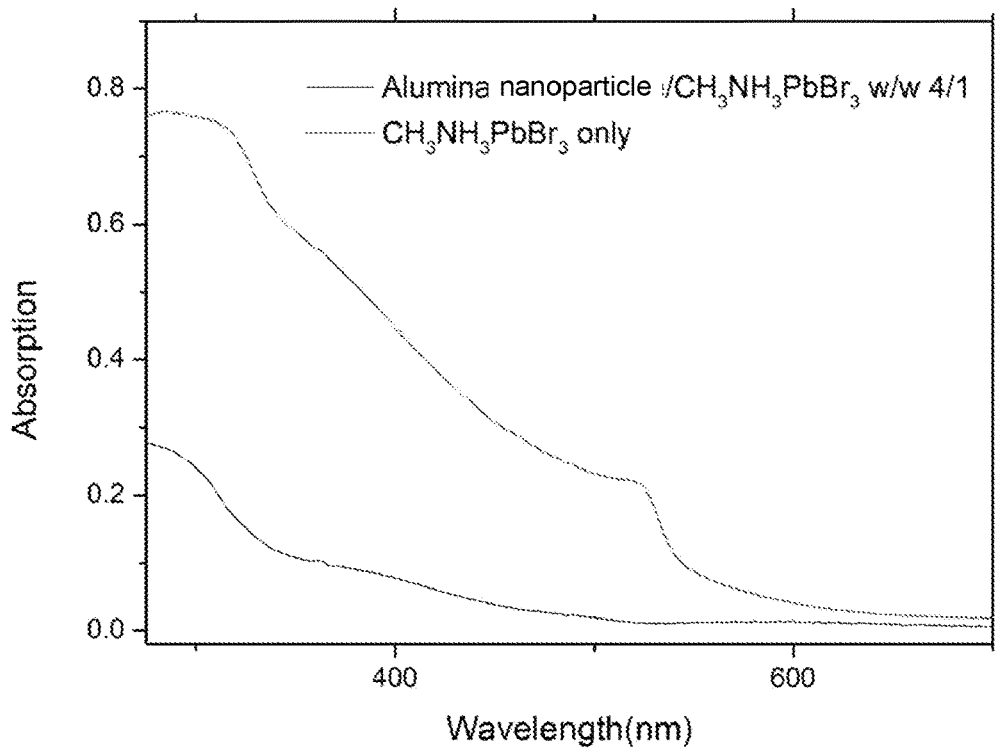
FIG. 7 shows absorption spectra of a CH$_3$NH$_3$PbBr$_3$ only film and a CH$_3$NH$_3$PbBr$_3$/alumina blend film.

The $CH_3NH_3PbBr_3$ precursor was prepared by mixing $CH_3NH_3Br$ and $PbBr_2$ in DMF at a molar ratio of 3:1, at concentrations of 5 wt %, 2.5 wt % and 1.7 wt %. Alumina nanoparticle dispersion in isopropanol (20 wt %, <50 nm particle size) was diluted using DMF to achieve different concentrations. The $CH_3NH_3PbBr_3$/alumina blending solution was made by blending perovskite solutions with the alumina dispersions. Alumina/perovskite composite films were spin-coated on oxygen plasma cleaned quartz spectrosil in a nitrogen glove box at 3000 rpm for 30 s, before being annealed at 60° C. for 1 minute. FIG. 6 shows the photoluminescence spectra of alumina nanoparticle/perovskite composite films with a range of alumina nanoparticle to perovskite weight ratios. It is clear that the peak photoluminescence may be tuned by altering the ratio of alumina nanoparticle to perovskite ratio, and in particular, the peak can be shifted towards shorter wavelengths by increasing the alumina nanoparticle concentration. FIG. 7 shows the absorption spectra of $CH_3NH_3PbBr_3$ only film and $CH_3NH_3PbBr_3$/alumina in a 1:4 weight ratio blend in more detail.

Figure 8:
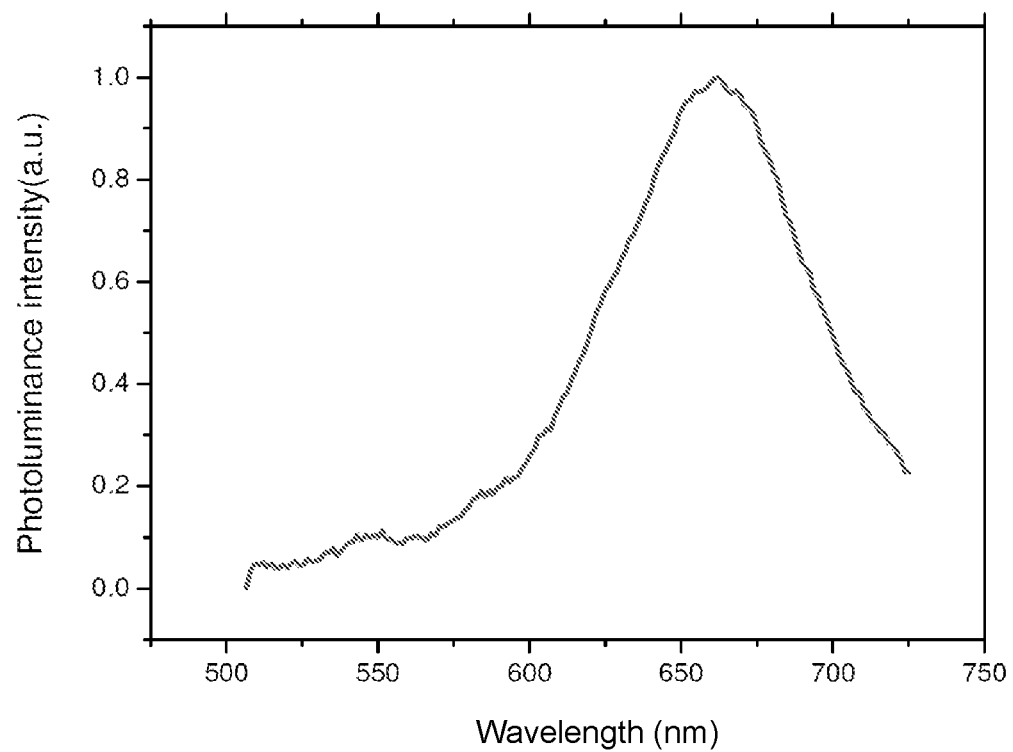
FIG. 8 shows photoluminescence spectroscopy data of CH$_3$NH$_3$PbBr$_2$I nanocrystals in an alumina matrix.

Alternatively, perovskite nanocrystals may be formed using $CH_3NH_3PbBr_2I$ particles in an alumina matrix. In this embodiment, the perovskite precursor is prepared by mixing 5 wt % $CH_3NH_3PbBr_3$ precursor solution in DMF and 5 wt % $CH_3NH_3PbI_3$ precursor solution in DMF (3:1 molar ratio between $CH_3NH_3I$ and $PbI_2$) at a volume ratio of 2:1. FIG. 8 shows photoluminescence spectroscopy data of such $CH_3NH_3PbBr_2I$ nanocrystals in an alumina matrix. The peak photoluminescence is shifted to longer wavelengths relative to that of the $CH_3NH_3PbBr_3$ nanocrystals (see FIG. 6). Thus, further tunability is possible by using different perovskite materials.

Materials and Fabrication Techniques

When the perovskite materials described above are used in the manufacture of organic optoelectronic devices, they are preferably dissolved to form solutions. The solutions may be used in solution processing techniques to form the active/emissive layer of such devices. The electrodes of the PeLEDs may be deposited by thermal evaporation. The emissive layer, the hole injecting layer and/or interlayer(s) may be deposited by solution processing, e.g. spin coating. Preferred devices of the invention are also encapsulated to avoid ingress of moisture and oxygen. Conventional encapsulation techniques may be used.

The PeLED substrate may be formed from any material conventionally used in the art such as glass or plastic. Optionally the substrate is pre-treated to improve adhesion thereto. Preferably the substrate is transparent. Preferably the substrate also has good barrier properties to prevent ingress of moisture or oxygen into the device.

The anode may comprise any material with a workfunction suitable for injection of holes into the light emitting layer. Preferably the anode is transparent. Representative examples of materials for use as a transparent anode include indium tin oxide (ITO) and indium zinc oxide (IZO). If the anode is not required to be transparent (e.g. if the cathode is transparent or it is a bottom emitting device) then opaque conducting materials such as opaque metals may be used as the anode.

The anode may comprise a single layer or may comprise more than one layer. For example, the anode may comprise a first anode layer and an auxiliary conductive layer between the anode and the hole injection layer such as a layer of organic conductive material between the anode and the hole injection layer.

The anode may be deposited on the substrate by thermal evaporation. The anode may be between 10 nm to 200 nm thick.

The hole injection layer may be deposited by a solution-based processing method. Any conventional solution-based processing method may be used. Representative examples of solution-based processing methods include spin coating, dip coating, slot die coating, doctor blade coating and ink-jet printing. In embodiments, spin coating is the preferred deposition method. The parameters used for spin coating the hole injection layer such as spin coating speed, acceleration and time are selected on the basis of the target thickness for the layer. After deposition, the hole injection layer is preferably annealed by heating, e.g. at 150 to 200° C. for 5 to 30 minutes in air. The thickness of the hole injection layer may be 15 to 100 nm, or between 30 to 50 nm.

As mentioned above, the devices may incorporate a thin insulating layer formed between either or both of the electrodes and the light-emitting layer. The insulating layer is preferably formed of an oxide or nitride, and more preferably the insulating layer is selected from the group consisting of aluminium oxide, silicon dioxide, silicon nitride, zinc oxide, nickel oxide or magnesium oxide. The interlayer can play an important role in improving the device efficiency and the lifetime of LEDs (because exciton quenching at the interface between the charge injecting layer(s) and the emissive layer is prevented or minimised). Preferably, the insulating layer is deposited by atomic layer deposition, ALD.

The light-emitting (emissive) layer may be prepared by depositing a solution as hereinbefore defined on the charge injecting layer or, when present, the interlayer. Any conventional solution-based processing method may be used. Representative examples of solution-based processing methods include spin coating, dip coating, slot die coating, doctor blade coating and ink-jet printing. In embodiments, the depositing is by spin coating. The parameters used for spin coating the light emitting layer such as spin coating speed, acceleration and time are selected on the basis of the target thickness for the light emitting layer. After depositing, the light emitting layer is preferably dried, e.g. at 100-150° C. in a glove box. The thickness of the light emitting layer may be between 50 to 350 nm or between 75 to 150 nm.

The cathode may comprise any material having a workfunction allowing injection of electrons into the light-emitting layer. In order to provide efficient injection of electrons into the device, the cathode preferably has a workfunction of less than 3.5 eV, more preferably less than 3.2 eV, most preferably less than 3 eV. Work functions of metals can be found in, for example, Michaelson, J. Appl. Phys. 48(11), 4729, 1977. The cathode may consist of a single material such as a layer of gold. Alternatively, it may comprise a plurality of metals, for example a bilayer or trilayer of a low workfunction material and a high workfunction material such as calcium and aluminium as disclosed in WO 98/10621; elemental barium as disclosed in WO 98/57381, Appl. Phys. Lett. 2002, 8 1(4), 634 and WO 02/84759; or a thin layer of metal compound, in particular an oxide or fluoride of an alkali or alkali earth metal, to assist electron injection, for example lithium fluoride as disclosed in WO 00/48258; barium fluoride as disclosed in Appl. Phys. Lett. 2001, 79(5), 2001; and barium oxide.

The cathode may be opaque or transparent. Transparent cathodes are particularly advantageous for active matrix devices because emission through a transparent anode in such devices is at least partially blocked by drive circuitry located underneath the emissive pixels. A transparent cathode comprises a layer of an electron injecting material that is sufficiently thin to be transparent. Typically, the lateral conductivity of this layer will be low as a result of its thinness. In this case, a layer of electron injecting material is used in combination with a thicker layer of transparent conducting material such as indium tin oxide.

The cathode may be deposited by thermal evaporation. The cathode may be 100 to 400 nm thick, or between 200 to 350 nm thick.

Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A material for absorption of any atmospheric moisture and/or oxygen that may permeate through the substrate or encapsulant may optionally be disposed between the substrate and the encapsulant.

The polyimide precursor (product number PI2525) was diluted into a concentration of 20 mg/ml in N-methyl-2-pyrrolidone before use.

$CH_3NH_3PbBr_3$ Perovskite Synthesis.

Methylammonium bromide ($CH_3NH_3Br$) was prepared by adding 33 wt % methylamine solution in ethanol (24 mL) and 48 wt % hydrobromic acid in water (8.5 mL) to 100 mL of absolute ethanol. The reaction mixture was stirred at room temperature. The solvent was removed by rotary evaporation. The obtained white crystals were washed with anhydrous diethyl ether and recrystallized in ethanol. The perovskite precursor solution was prepared by mixing $CH_3NH_3Br$ and $PbBr_3$ in a 3:2 molar ratio in anhydrous N,N-dimethylformamide to give a concentration of 5 wt %.

PeLED Fabrication.

Blend solutions were prepared by mixing 5 wt % $CH_3NH_3PbBr_3$ solutions and diluted PIP solutions to give different weight ratios. These blend solutions were stirred under room temperature for 2 hours before use.

ITO-coated glass substrate was cleaned successively with acetone and isopropanol for 15 minutes, followed by 10 minutes oxygen plasma treatment. PEDOT:PSS (Clevios P VP Al 4083) was spin coated onto the substrate at 6000 rpm for 30 seconds and annealed at 140 degree for 30 minutes in a nitrogen glovebox. The blend solutions were spin coated onto PEDOT:PSS at 3000 rpm for 30 seconds and annealed at 60 degree for 1 minute. A solution of F8 in chlorobenzene (10 mg mL$^{-1}$) was spin coated onto the perovskite layer at 3000 rpm for 30 seconds to give a 50 nm film. We note that PIP is insoluble in chlorobenzene and is unaffected by the deposition of the F8 layer. Ca (20 nm) and Ag (100 nm) were successively deposited by vacuum thermal evaporation at vacuum better than $3 \times 10^{-6}$ mbar. Devices were tested in air without encapsulation.

PeLED Characterization.

Current vs. voltage characteristics were measured using a Keithley 2400 Source Measure Unit (SM U). Photon flux was measured simultaneously using a calibrated silicon photodiode centred over the light-emitting pixel. Luminance in cd m$^{-2}$ was calculated based on the emission spectrum of the PeLED, and on the known spectral response of the silicon photodiode. External quantum efficiency was calculated, assuming a Lambertian emission profile. Electroluminescence spectra were measured using a Labsphere CDS-610 spectrometer.

SUMMARY

It is shown that luminescent perovskite nanocrystals can be embedded in a pinhole-free matrix of dielectric polymer to give superior light-emitting diode performance. This technique is completely solution processed and remarkably simple, and could potentially be extended to perovskite solar cells to solve current leakage problems. This incorporation of a polymer matrix further gives the device an added advantage of flexibility for an otherwise brittle perovskite material.

It is certainly interesting and perhaps surprising that a crystalline perovskite material can form and associate so well with a polymeric mixture without the need for any complex surface modification, and still retain its remarkable optoelectronic properties. This is possibly granted by the unique inorganic-organic hybrid nature of the organometal halide perovskites. It is expected that this extraordinary compatibility of perovskites with organic materials, coupled with their respectable light-emitting and optoelectronic performance will make them valuable for a range of flexible displays and lighting applications.

No doubt many other effective alternatives within the scope of the presently claimed invention will occur to the skilled person. It will be understood that the invention is not limited to the described embodiments and encompasses modifications apparent to those skilled in the art lying within the spirit and scope of the claims appended hereto.

The invention claimed is:

1. A method for the preparation of a thin layer of semiconducting perovskite nanoparticles embedded in a matrix or blend of a material that has a wider band gap than the semiconducting perovskite nanoparticles, the method comprising blending a solution comprising semiconducting perovskite material or a precursor therefor and a material that has a wider band gap than the semiconducting perovskite material or a precursor therefor followed by removal of the solvent from the mixture thus formed, to give said semiconducting perovskite nanoparticles embedded in a matrix or blend of the material that has a wider band gap than the semiconducting perovskite nanoparticles;

wherein the semiconducting perovskite comprises perovskite with an $AMX_3$ structure, where A is a monovalent cation, M is a divalent cation and X is a halide anion; and;

wherein the ratio by weight of semiconducting perovskite nanoparticles:the material that has a wider band gap than the semiconducting perovskite nanoparticles in which the semiconducting perovskite nanoparticles are embedded is from 0.01:1 to 2:1.

2. The method according to claim 1, wherein the material that has a wider band gap than the semiconducting perovskite nanoparticles has a band gap of greater than 1.5 eV.

3. The method according to claim 1, wherein the material that has a wider band gap than the semiconducting perovskite nanoparticles is selected from the group consisting of an insulating material and a semiconducting material.

4. The method according to claim 3, wherein the insulating material is selected from an insulating polymer, an insulating organic molecule and an insulating inorganic material; including wherein the insulating polymer or insulating organic molecule is a polar polymer or a polar organic molecule;

wherein the insulating material is a polyimide, including a polyamic acid of benzophenone tetracarboxylic dianhydride 4,4-oxydianiline m-phenylenediamine polymer (PIP) having the following formula:

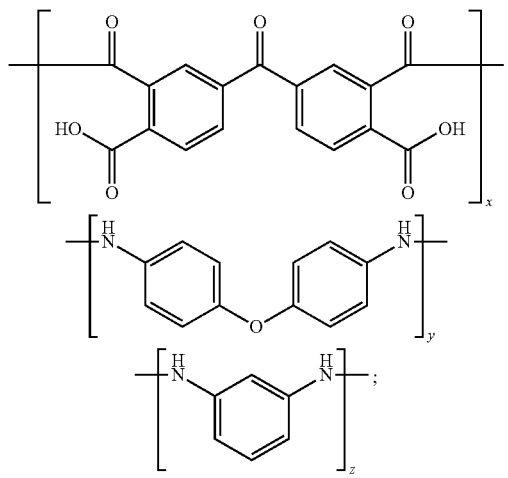

polystyrene; poly (9-vinylcarbazole), of the form:

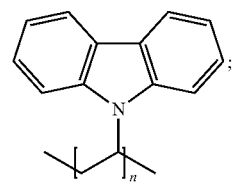

the organic compound 4,4-bis(N-carbazolyl)-1,1-biphenyl, of the form:

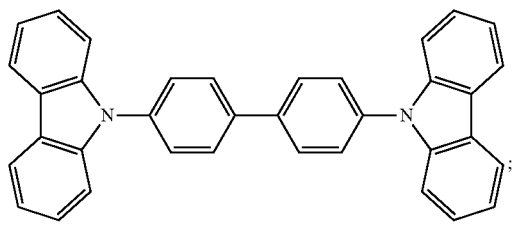 [SMILES: c1ccc2c(c1)c1ccccc1n2-c1ccc(-c2ccc(-n3c4ccccc4c4ccccc43)cc2)cc1]

or alumina.

5. The method according to claim 1, wherein the thickness of the thin layer of semiconducting perovskite nanoparticles embedded in the matrix or blend of the material that has a wider band gap than the semiconducting perovskite nanoparticles is ≤500 nm.

6. The method according to claim 1 wherein:
the divalent cation M is:
  a divalent metal cation, including tin ($Sn^{2+}$) or lead ($Pb^{2+}$); and/or
the monovalent cation A is:
  a primary, secondary or tertiary ammonium cation $[HNR^1R^2R^3]^+$, wherein each of $R^1$, $R^2$ and $R^3$ may be the same or different and is selected from hydrogen, an unsubstituted or substituted $C_1$-$C_{20}$ alkyl group and an unsubstituted or substituted $C_5$-$C_{18}$ aryl group; and/or
  of the form $[R^1R^2N-CH=NR^3R^4]^+$:

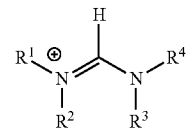

wherein each of $R^1$, $R^2$, $R^3$ and $R^4$ may be the same or different and is selected from hydrogen, an unsubstituted or substituted $C_1$-$C_{20}$ alkyl group and an unsubstituted or substituted $C_5$-$C_{18}$ aryl group; and/or
of the form $(R^1R^2N)(R^3R^4N)C=NR^3R^6$:

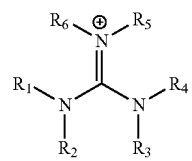

wherein each of $R^1R^2$, $R^3$, $R^4$, $R^5$ and $R^6$ may be the same or different and is selected from hydrogen, an unsubstituted or substituted $C_1$-$C_{20}$ alkyl group and an unsubstituted or substituted $C_5$-$C_{18}$ aryl group; and/or an alkali metal cation, including caesium ($Cs^+$) or rubidium ($Rb^+$); and/or X is:

a halide anion selected from chloride, bromide, iodide, and fluoride and, in the $AMX_3$ structure each halide may be the same or different.

7. The method according to claim 1, wherein the perovskite material has an $A_{1-j}B_jMX_3$ structure, wherein:

A and B are each a monovalent cation as claimed in claim 6, where A and B are different;

M is a divalent metal cation as claimed in claim 6;

X is a halide anion as claimed in claim 6; and i is between 0 and 1; or wherein the perovskite material has an $AMX_{3-k}Y_k$ structure, wherein:

A is a monovalent cation as claimed in claim 6;

M is a divalent metal cation as claimed in claim 6;

X and Y are each a halide anion as claimed in claim 6, where X and Y are different; and k is between 0 and 3; or wherein the perovskite material has an $AM_{1-j}N_jX_3$ structure, wherein:

A is a monovalent cation as claimed in claim 6;

M and N are each a divalent metal cation as claimed in claim 6;

X is a halide anion as claimed in claim 6; and j is between 0 and 1; or wherein the perovskite material has an $A_{1-i}B_iM_{1-j}N_jX_{3-k}Y_k$ structure, wherein:

A and B are each a monovalent cation as claimed in claim 6, where A and B are different;

M and N are each a divalent metal cation as claimed in claim 6;

X and Y are each a halide anion as claimed in claim 6, where X and Y are different; and where i is between 0 and 1, j is between 0 and 1, and k is between 0 and 3.

8. A thin layer of semiconducting perovskite nanoparticles embedded in a matrix or blend of a material that has a wider band gap than the semiconducting perovskite nanoparticles prepared according to the method as recited in claim 1.

9. A solid state device including a thin layer of semiconducting perovskite nanoparticles embedded in a matrix or blend of a material that has a wider band gap than the semiconducting perovskite nanoparticles made according to the method of claim 1.

10. The solid state device according to claim 9, wherein the solid state device is a light emitting diode or a solar cell.

* * * * *

UNITED STATES PATENT AND TRADEMARK OFFICE
CERTIFICATE OF CORRECTION

PATENT NO. : 10,636,993 B2
APPLICATION NO. : 15/531404
DATED : April 28, 2020
INVENTOR(S) : Friend et al.

Page 1 of 1

It is certified that error appears in the above-identified patent and that said Letters Patent is hereby corrected as shown below:

In the Claims

At Column 20, Claim number 6, Line number 56, replace "$(R^1R^2N)(R^3R^4N)C=NR^3R^6$:" with -- $(R^1R^2N)(R^3R^4N)C=NR^5R^6$: --.

At Column 21, Claim number 7, Line number 10, replace "$A_{1-j}B_iMX_3$" with -- $A_{1-i}B_iMX_3$ --.

Signed and Sealed this
Ninth Day of June, 2020

Andrei Iancu
*Director of the United States Patent and Trademark Office*